(12) United States Patent
Tatsumi

(10) Patent No.: US 11,126,017 B2
(45) Date of Patent: Sep. 21, 2021

(54) DRIVING CIRCUIT FOR OPTICAL DEVICE

(71) Applicant: SUMITOMO ELECTRIC INDUSTRIES, LTD., Osaka (JP)

(72) Inventor: Taizo Tatsumi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/084,209

(22) Filed: Oct. 29, 2020

(65) Prior Publication Data

US 2021/0141247 A1 May 13, 2021

(30) Foreign Application Priority Data

Nov. 7, 2019 (JP) .............................. JP2019-202464

(51) Int. Cl.
*H03F 3/45* (2006.01)
*G02F 1/01* (2006.01)
*H01S 5/042* (2006.01)
*H04B 10/50* (2013.01)
*H03K 17/60* (2006.01)

(52) U.S. Cl.
CPC .......... *G02F 1/0121* (2013.01); *H01S 5/0427* (2013.01); *H03F 3/45475* (2013.01); *H03K 17/60* (2013.01); *H04B 10/50* (2013.01)

(58) Field of Classification Search
CPC ........ G02F 1/0121; H01S 5/0427; H03F 3/45; H03F 3/45475; H03K 17/60; H04B 10/50
USPC .................................................. 327/108, 109
See application file for complete search history.

(56) References Cited

U.S. PATENT DOCUMENTS

| | | | |
|---|---|---|---|
| 6,097,159 A | 8/2000 | Mogi et al. | |
| 9,369,100 B2* | 6/2016 | Tatsumi | .................. H03F 3/605 |
| 9,500,886 B2* | 11/2016 | Tatsumi | ............... H04B 10/588 |
| 2017/0025816 A1 | 1/2017 | Tanaka | |
| 2018/0210239 A1 | 7/2018 | Tatsumi | |

FOREIGN PATENT DOCUMENTS

| | | |
|---|---|---|
| JP | H11-251668 | 9/1999 |
| JP | 2017-028043 | 2/2017 |
| JP | 2018-121217 | 8/2018 |

\* cited by examiner

*Primary Examiner* — William Hernandez
(74) *Attorney, Agent, or Firm* — Smith, Gambrell & Russell, LLP.

(57) ABSTRACT

A driving circuit includes a plurality of differential amplifier circuits each electrically connected to a power supply line. Each differential amplifier circuit includes a differential pair circuit and a series resistance circuit. In the differential pair circuit, a first transistor and a second transistor are electrically connected to the power supply line through a first load resistor and a second load resistor, respectively. A center node is electrically connected between the first transistor and the second transistor. Each differential amplifier circuit generates a differential output signal in accordance with a differential incoming signal. The series resistance circuit includes a resistor and a line element. The line element includes a signal line which extends straight with a distance between the signal line and a ground line extending in parallel thereto. The resistor and the line element are connected in series between the center node and a static potential line.

14 Claims, 16 Drawing Sheets

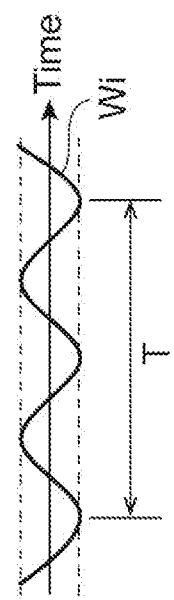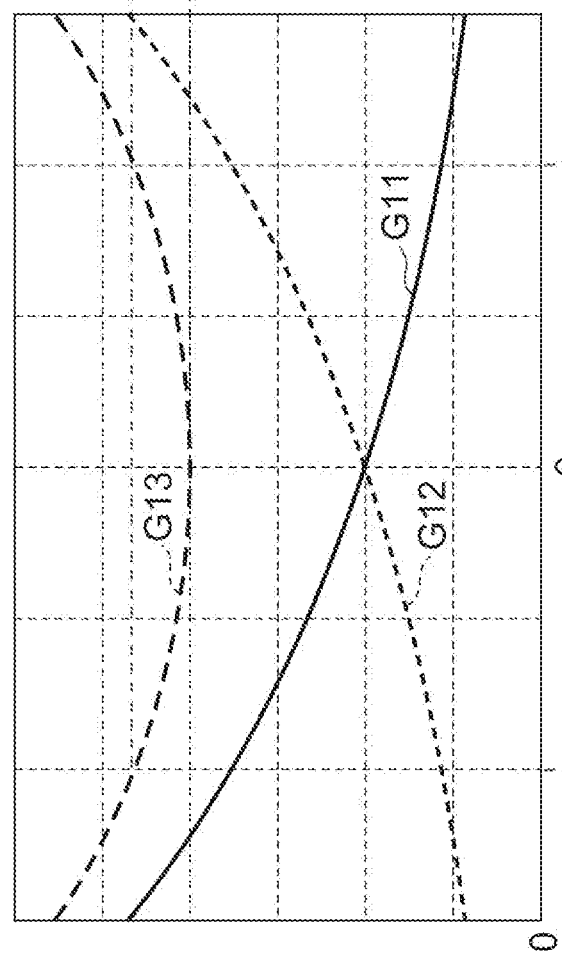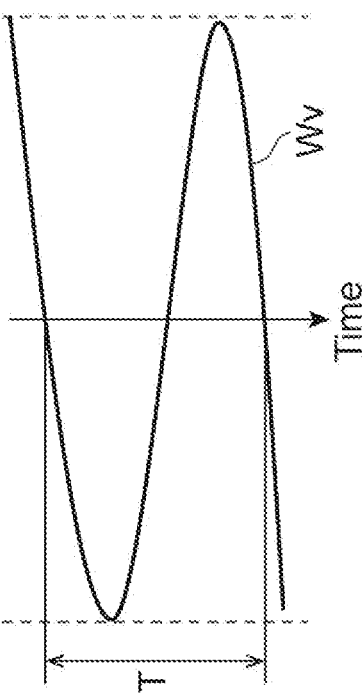

DRIVING CIRCUIT FOR OPTICAL DEVICE

CROSS REFERENCE TO RELATED APPLICATIONS

The present application claims priority based on Japanese Patent Application No. 2019-202464, which was filed on Nov. 7, 2019, the entire content disclosed in the aforementioned Japanese patent applications being incorporated herein by reference.

TECHNICAL FIELD

The present disclosure relates to a driving circuit for an optical device.

BACKGROUND

An optical transmitter module used in optical communication systems generates an optical signal by driving a light emitting element (direct modulation system) or an optical modulator (indirect modulation system). In the direct modulation system, a modulation signal provided from a driving circuit is directly input to the light emitting element. Thereby, the light emitting element outputs a modulated light. In the indirect modulation system, a continuous wave light output from a light emitting element is input to an optical modulator such as an Electro-Absorption Modulator (EAM) or a Mach-Zender Modulator (MZM). A modulation signal is input to the optical modulator from a driving circuit, and a modulated light is output from the optical modulator.

In recent years, high modulation speeds of 28 Gbaud to 56 Gbaud have been demanded in accordance with the increase of the optical transmission capacity. Therefore, instead of the conventional NRZ system, a multi-level signaling system such as PAM4 is being adopted. In a large-capacity optical communication system, a plurality of differential amplifier circuits is required to drive a plurality of light emitting elements or optical modulators corresponding to number of channels. Usually, a power supply is shared for the differential amplifier circuits. However, a power supply noise caused by a certain differential amplifier circuit may affect the other differential amplifier circuit through a power supply line. The power supply noise may deteriorate quality of a modulated light output from the optical device driven by the other differential amplifier circuit.

SUMMARY

The present disclosure provides a driving circuit for an optical device. The driving circuit includes a plurality of differential amplifier circuits each electrically connected to a power supply line. Each differential amplifier circuit includes a differential pair circuit and a series resistance circuit. The differential pair circuit includes a first load resistor, a second load resistor, a first transistor, a second transistor, and a center node. The first transistor has a control terminal, a first current terminal, and a second current terminal. The first current terminal is electrically connected to the power supply line through the first load resistor. The second transistor has a control terminal, a first current terminal, and a second current terminal. The first current terminal of the second transistor is electrically connected to the power supply line through the second load resistor. The center node is electrically connected between the second current terminal of the first transistor and the second current terminal of the second transistor. The control terminal of the first transistor and the control terminal of the second transistor receive a differential incoming signal, and the first load resistor and the second load resistor generate a differential output signal in accordance with the differential incoming signal. The series resistance circuit includes a resistor and a line element. The line element includes a signal line having a width. The signal line extends straight in one direction with a distance between the signal line and a ground line extending in parallel to the signal line. The resistor and the line element are connected in series between the center node of the differential pair circuit and a static potential line.

BRIEF DESCRIPTION OF THE DRAWINGS

FIG. 9A shows a relation between a differential input signal and a collector current of transistors. FIG. 9B shows a periodic voltage waveform. FIG. 9C shows a current waveform.

DETAILED DESCRIPTION

Figure 1:
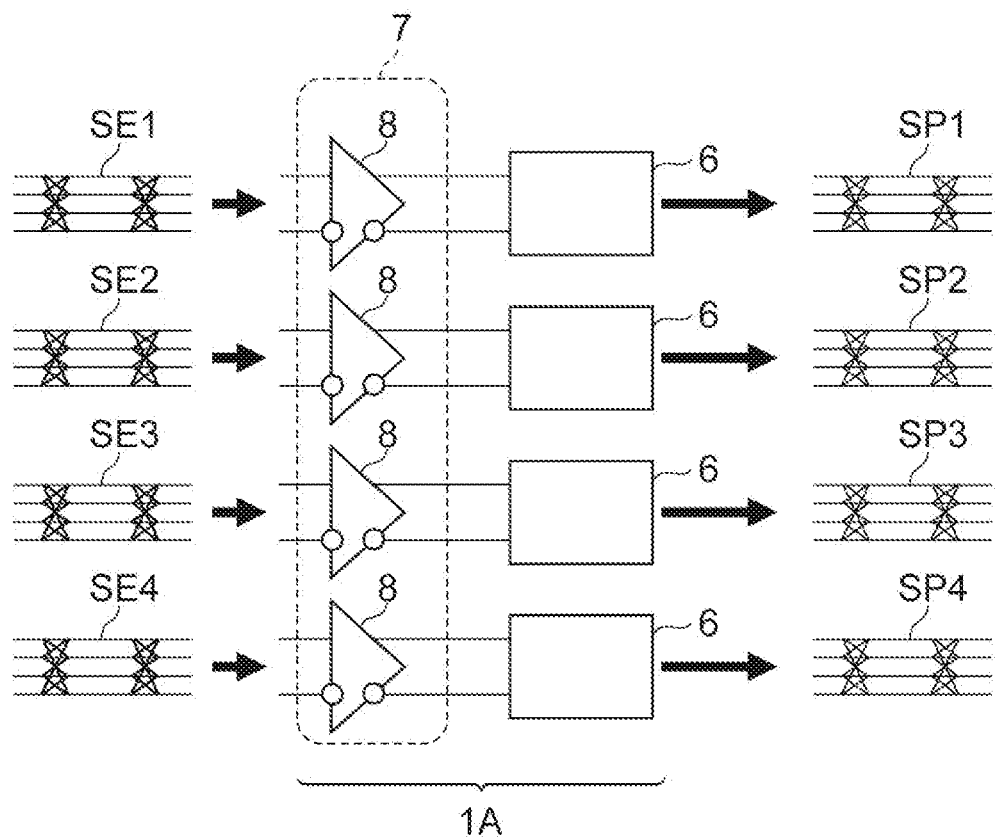
FIG. 1 is a diagram illustrating a schematic configuration of an optical transmitter module including a driving circuit according to an embodiment of the present disclosure.

Specific examples of a driving circuit of the present disclosure will be described below with reference to the accompanying drawings. It should be noted that the present invention is not limited to these examples, but is indicated by the claims, and it is intended to include all modifications within the meaning and range equivalent to the claims. In the following description, in the description of the drawings, the same elements are denoted by the same reference numerals, and a repetitive description thereof is omitted.

In the following explanation, each transistor is a heterojunction bipolar transistor, but it may be either a bipolar transistor or a field effect transistor. When each transistor is a bipolar transistor, control terminal denotes base, and current terminals denote emitter and collector. For example, when each transistor is a field effect transistor (FET), a control terminal means gate of the FET, and current terminals corresponds to source and drain of the FET. In the following description, "connection" means electrical connection. For example, the electrical connection may be a connection through a conductive path with a resistance value of substantially zero or a connection through an electronic component such a resistor.

FIG. 1 is a diagram illustrating a schematic configuration of an optical transmitter module 1A including a driving circuit according to an embodiment of the present disclosure. The optical transmitter module 1A receives electrical incoming signals SE1, SE2, SE3 and SE4, which are N differential voltage signals (N is an integer equal to or greater than 2, where N=4 is exemplified in the drawing), and converts them into optical outgoing signals SP1, SP2, SP3 and SP4, respectively. The optical outgoing signals SP1, SP2, SP3 and SP4 are output from the optical transmitter module 1A. For example, the optical transmitter module 1A includes N optical modulators 6 and a driving circuit 7 including N differential amplifier circuits 8. Each differential amplifier 8 drives a corresponding optical modulator 6. The N differential amplifier circuits 8 operate in parallel with each other. The N differential amplifier circuits 8 receive the electrical incoming signals SE1, SE2, SE3 and SE4, and generate N driving signals for driving the N optical modulators 6. The N optical modulators 6 receive the N driving signals from the differential amplifier circuits 8 and receive N continuous wave (CW) lights from N semiconductor lasers (not shown). Each optical modulator 6 modulates a corresponding CW light based on a corresponding driving signal input from a corresponding differential amplifier circuit 8, and outputs a modulated CW light as one of the optical outgoing signals SP1, SP2, SP3 and SP4. The optical transmitter module 1A may include N semiconductor lasers for direct modulation instead of the N optical modulators 6 for indirect modulation. Each of the N differential amplifier circuit 8 then directly drives a corresponding semiconductor laser. The N semiconductor lasers output the N optical outgoing signals SP1, SP2, SP3 and SP4.

Figure 2:
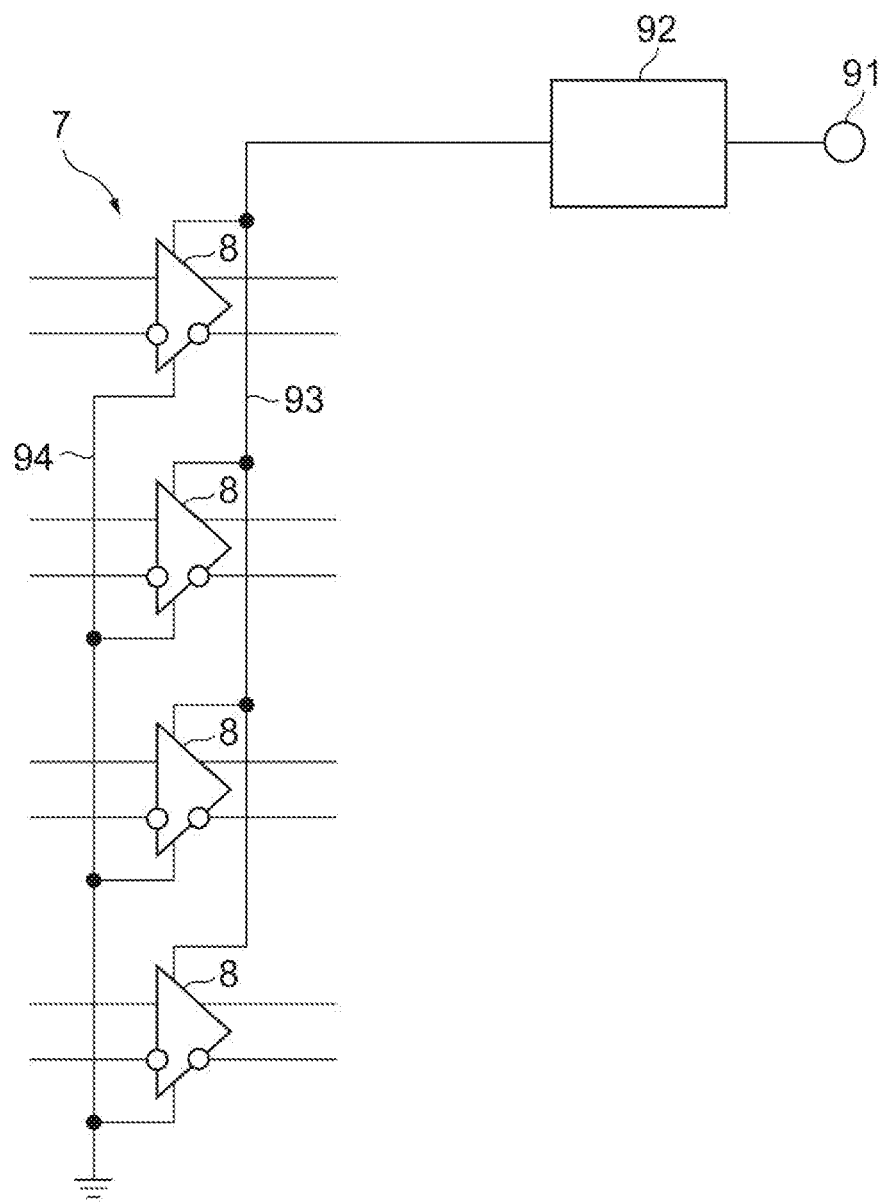
FIG. 2 is a diagram illustrating a power supply line providing supply voltage to a driving circuit.

FIG. 2 is a diagram illustrating a power supply line providing a supply voltage to a driving circuit 7. As shown in FIG. 2, a common power supply line 93 and a common static potential line 94 are connected to each of the N differential amplifier circuits 8 included in the driving circuit 7. The static potential line 94 is, for example, a wiring line for providing a reference potential (ground potential) to each of the N differential amplifier circuits 8. The power supply line 93 is, for example, a wiring line for providing the supply voltage to each of the N differential amplifier circuits 8. One end of the power supply line 93 is electrically connected to a power supply terminal 91 through a filter circuit 92, and the other end of the power supply line 93 branches to each differential amplifier circuit 8. The supply voltage which voltage value is predetermined is input to the power supply terminal 91 from outside of the optical transmitter module 1A. The filter circuit 92 prevents power supply noise from entering the N differential amplifier circuits 8. Note that the power supply line 93 has a parasitic inductance of, for example, about 0.1 nH to 1 nH. This parasitic inductance may include parasitic inductance of bonding wires and parasitic inductance of patterned wiring lines on a circuit board.

Figure 3:
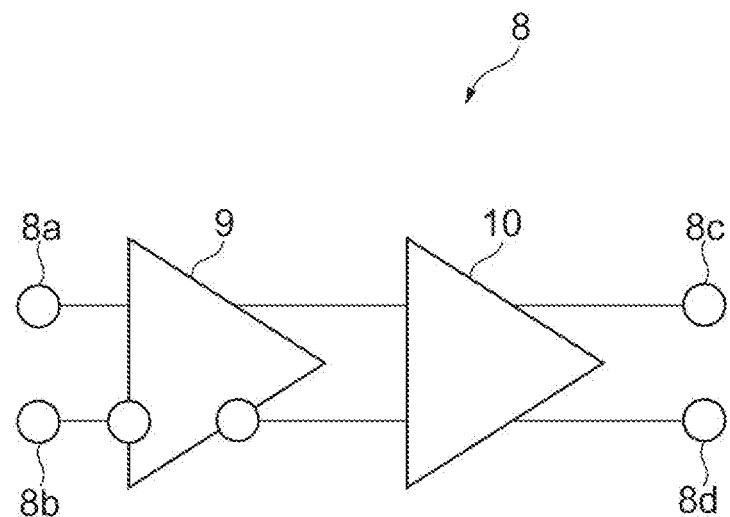
FIG. 3 is a diagram showing an inner configuration of a differential amplifier circuit.

FIG. 3 is a diagram showing an inner configuration of differential amplifier circuit 8. As shown in FIG. 3, the differential amplifier circuit 8 has, for example, a pre-buffer 9 and an output buffer 10 at a rear stage of the pre-buffer 9. The pre-buffer 9 and the output buffer 10 are constituted by differential amplifier circuits, respectively. A positive-phase input terminal of the pre-buffer 9 is electrically connected to a signal input terminal 8a. A negative-phase input terminal of the pre-buffer 9 is electrically connected to a signal input terminal 8b. The positive-phase input terminal is, for example, a non-inverting input terminal, and the negative-phase input terminal is, for example, an inverting input terminal. Each of the electrical incoming signals SE1, SE2, SE3 and SE4 shown in FIG. 1 is, for example, a differential voltage signal including a positive-phase component and a negative-phase component. The positive-phase component and the negative-phase component are complimentary paired signals. The positive-phase component has a phase opposite to a phase of the negative-phase component. For example, when the positive-phase component increases, the negative-phase component decreases, and vice versa. The signal input terminal 8a receives, for example, the positive-phase component of the electrical incoming signal, and the signal input terminal 8b receives the negative-phase component of the electrical incoming signal. The pre-buffer 9 amplifies the electrical incoming signal (differential incoming signal) input through the signal input terminals 8a and 8b, and outputs the amplified electrical incoming signal as a differential voltage signal. A positive-phase input terminal and a negative-phase input terminal of the output buffer 10 are electrically connected to a positive-phase output terminal and a negative-phase output terminal of the pre-buffer 9, respectively. The output buffer 10 receives the amplified electrical incoming signal from the pre-buffer 9, and further amplifies the amplified electrical incoming signal. The further amplified electrical incoming signal is output from the output buffer 10 as a differential voltage signal. A positive-phase output terminal and a negative-phase output terminal of the output buffer 10 are electrically connected to signal output terminals 8c and 8d. The positive-phase component and the negative-phase component of the electrical incoming signal after being amplified by the output buffer 10 are provided to the optical modulator 6 (See FIG. 1) through the signal output terminals 8c and 8d.

Figure 4:
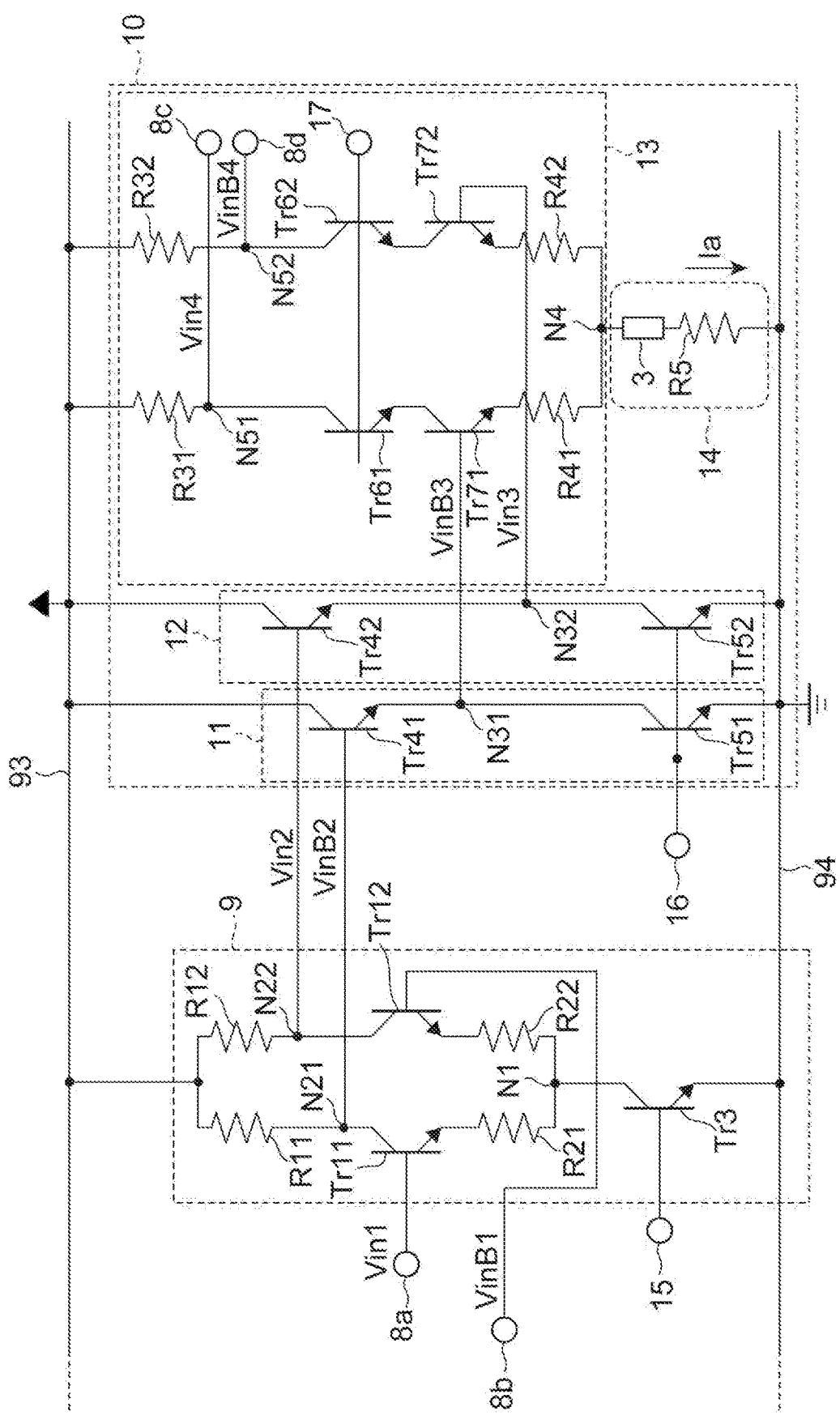
FIG. 4 is a schematic diagram showing a detailed configuration of a pre-buffer and an output buffer.

FIG. 4 is a circuit diagram showing a detailed configuration of the pre-buffer 9 and the output buffer 10. As shown in FIG. 4, the pre-buffer 9 includes a pair of transistors Tr11 and Tr12, a pair of load resistors R11 and R12, a pair of resistors R21 and R22, and a transistor Tr3. Each of the transistors Tr11, Tr12, and Tr3 is, for example, a bipolar transistor, specifically a hetero bipolar transistor (HBT) in one embodiment. The load resistors R11 and R12, the transistors Tr11 and Tr12, and the resistors R21 and R22 constitute a differential pair circuit. Specifically, control terminals of the transistors Tr11 and Tr12 are electrically connected to the signal input terminals 8a and 8b. The control terminal (base) of the transistor Tr11 receives the positive-phase component Vin1 of the electrical incoming signal, and the control terminal (base) of the transistor Tr12 receives the negative-phase component VinB1 of the electrical incoming signal. One current terminal (e.g., collector) of the transistor Tr11 is electrically connected to the power supply line 93 through the load resistor R11, and the other current terminal (e.g., emitter) of the transistor Tr11 is electrically connected to a node N1 through the resistor R21. One current terminal (e.g., collector) of the transistor Tr12 is electrically connected to the power supply line 93 through the load resistor R12, and the other current terminal (e.g., emitter) of the transistor Tr12 is electrically connected to the node N1 through the resistor R22. That is, the other current terminals (e.g., emitters) of the transistors Tr11 and Tr12 are electrically connected to each other through the respective resistors R21 and R22. In one embodiment, the transistor Tr11 has a structure identical to a structure of the transistor Tr12, and has dimensions equal to dimensions of the transistor Tr12, so that electrical characteristics of the transistor Tr11 becomes equal to electrical characteristics of the transistor Tr12. The load resistor R11 may have a resistance value equal to a resistance value of the load resistor R12. The resistor R21 may have a resistance value equal to a resistance value of the resistor R22.

The transistor Tr3 is a current source transistor for providing a static current to the differential pair circuit. The transistor Tr3 may vary current value of the static current. The transistor Tr3 is electrically connected between the node N1 and the static potential line 94. That is, one current terminal (e.g., collector) of the transistor Tr3 is electrically connected to the node N1, and the other current terminal (e.g., emitter) is electrically connected to the static potential line 94. The control terminal of the transistor Tr3 is electrically connected to an adjustment terminal 15 and receives a control voltage through the adjustment terminal 15 for adjusting the current value of the static current, which flows through the differential pair circuit from the power supply line 93 to the static potential line 94.

In the pre-buffer 9, when the negative-phase component VinB1 of the electrical incoming signal turns off the transistor Tr12 and the positive-phase component Vin1 of the electrical incoming signal turns on the transistor Tr11, the static current regulated by the transistor Tr3 flows through the load resistor R11, the transistor Tr11, and the resistor R21. At this time, potential of a node N21 between the load resistor R11 and the transistor Tr11 becomes lower by a voltage drop of the load resistor R11 through which the static current flows than potential of the power supply line 93, and potential of a node N22 between the load resistor R12 and the transistor Tr12 becomes substantially equal to the potential of the power supply line 93. When the positive-phase component Vin1 turns off the transistor Tr11 and the negative-phase component VinB1 turns on the transistor Tr12, the static current regulated by the transistor Tr3 flows through the load resistor R12, the transistor Tr12, and the resistor R22. At this time, the potential of the node N22 becomes lower by a voltage drop of the load resistor R12 through which the static current flows than the potential of the power supply line 93, and the potential of the node N21 becomes substantially equal to the potential of the power supply line 93. Since the positive-phase component Vin1 and the negative-phase component VinB1 of the electrical incoming signal are complimentarily changes, the potentials of the nodes N21 and N22 are also complimentarily changes. Thus, the positive-phase component Vin2 and the negative-phase component VinB2 are generated by amplifying the positive-phase component Vin2 and the negative-phase component VinB2, and output from the nodes N21 and N22 to the outside of the pre-buffer 9.

The output buffer 10 has a pair of emitter follower circuits 11 and 12, a differential pair circuit 13, and a series resistance circuit 14. The emitter follower circuit 11 includes a transistor Tr41 and a transistor Tr51. The transistors Tr41 and Tr51 are, for example, bipolar transistors, specifically HBTs in one embodiment. The transistor Tr41 and the transistor Tr51 are connected in series with each other between the power supply line 93 and the static potential line 94. Specifically, one current terminal (e.g., collector) of the transistor Tr41 is electrically connected to the power supply line 93, and the other current terminal (e.g., emitter) is electrically connected to one current terminal (e.g., collector) of the transistor Tr51. The other current terminal (e.g., emitter) of the transistor Tr51 is electrically connected to the static potential line 94. A control terminal of the transistor Tr41 is electrically connected to the node N21 and receives the amplified negative-phase component VinB2 by the pre-buffer 9. The transistor Tr51 is a current source transistor that regulates a static current flowing through the emitter follower circuit 11 from the power supply line 93 to the static potential line 94. A control terminal of the transistor Tr51 is electrically connected to an adjustment terminal 16, and receives a control voltage through the adjustment terminal 16 for adjusting a current value of the static current flowing through the emitter follower circuit 11.

The emitter follower circuit 12 has a transistor Tr42 and a transistor Tr52. The transistors Tr42 and Tr52 are, for example, bipolar transistors, specifically HBTs in one embodiment. The transistor Tr42 and the transistor Tr52 are connected in series with each other between the power supply line 93 and the static potential line 94. Specifically, one current terminal (e.g., collector) of the transistor Tr42 is electrically connected to the power supply line 93, and the other current terminal (e.g., emitter) of the transistor Tr42 is electrically connected to one current terminal (e.g., collector) of the transistor Tr52. The other current terminal (e.g., emitter) of the transistor Tr52 is electrically connected to the static potential line 94. A control terminal of the transistor Tr42 is electrically connected to the node N22 and receives the amplified positive-phase component Vin2 by the pre-buffer 9. The transistor Tr52 is a current source transistor that regulates a static current flowing through the emitter follower circuit 12 from the power supply line 93 to the static potential line 94. A control terminal of the transistor Tr52 is electrically connected to the adjustment terminal 16 and receives the control voltage through the adjustment terminal 16 for adjusting a current value of the static current flowing through the emitter follower circuit 12.

When the potential of the negative-phase component Vin2B output from the pre-buffer 9 becomes higher, the potential of a node N31 between the transistor Tr41 and the transistor Tr51 becomes higher. The emitter follower circuit 11 shifts the potential of the negative-phase component Vin2B toward the static potential, and outputs the shifted potential of the negative-phase component Vin2B When the potential of the positive-phase component Vin2 output from the pre-buffer 9 becomes higher, the potential of a node N32 between the transistor Tr42 and the transistor Tr52 becomes higher. The emitter follower circuit 12 shifts the potential of the positive-phase component Vin2 toward the static potential, and outputs the shifted potential of the positive-phase component Vin2 Since the positive-phase component Vin2 and the negative-phase component VinB2 complimentarily changes, the potentials of the nodes N31 and N32 also complimentarily changes. Thus, a positive-phase component Vin3 and a negative-phase component VinB3 shifted from the positive-phase component Vin2 and the negative-phase component VinB2 by the emitter follower circuits 11 and 12 are outputted from the node N31 and N32.

Although the control terminals of the transistors Tr51 and Tr52 are electrically connected to the adjustment terminal 16 in the present embodiment, these control terminals may be electrically connected to separate adjustment terminals. Adjustment voltages input to the separate adjustment terminals may be different from each other.

The differential pair circuit 13 includes load resistors R31 and R32, transistors Tr61 and Tr62, transistors Tr71 and Tr72, and the resistors R41 and R42. The transistors Tr61, Tr62, Tr71 and Tr72 are, for example, bipolar transistor, specifically HBTs in one embodiment.

The transistor Tr71 is a first transistor in the present embodiment, and works as one of a differential transistor pair. One current terminal (first current terminal, e.g., collector) of the transistor Tr71 is electrically connected to the power supply line 93 through the load resistor R31 (first load resistor) and a transistor Tr61 connected in series with the load resistor R31. Specifically, one end of the load resistor R31 is electrically connected to the power supply line 93, and the other end of the load resistor 31 is electrically connected to one current terminal (e.g., collector) of the transistor Tr61. The other current terminal (e.g., emitter) of the transistor Tr61 is electrically connected to one current terminal (e.g., collector) of the transistor Tr71. A control terminal (e.g., base) of the transistor Tr71 is electrically connected to the node N31, and receives a negative-phase component Vin3B output from the emitter follower circuit 11. The resistor R41 is electrically connected between the other current terminal (second current terminal, e.g., emitter) of the transistor Tr71 and a node N4.

The transistor Tr72 is a second transistor in the present embodiment, and works as the other of the differential transistor pair. One current terminal (e.g., collector) of the transistor Tr72 is electrically connected to the power supply line 93 through the load resistor R32 (second load resistor) and a transistor Tr62 connected in series with the load resistor R32. Specifically, one end of the load resistor R32 is electrically connected to the power supply line 93, and the other end of the load resistor R32 is electrically connected to one current terminal (e.g., collector) of the transistor Tr62. The other current terminal (e.g., emitter) of the transistor Tr62 is electrically connected to one current terminal (e.g., collector) of the transistor Tr72. A control terminal (e.g., base) of the transistor Tr72 is electrically connected to the node N32 and receives the positive-phase component Vin3 output from the emitter follower circuit 12. The resistor R42 is electrically connected between the other current terminal (e.g., emitter) of the transistor Tr72 and the node N4. That is, the other current terminals (e.g., emitters) of the transistors Tr71 and Tr72 are connected to each other through the respective resistors R41 and R42. That is, the other current terminal of the transistor Tr71 and the other current terminal of the transistor Tr72 are electrically connected to each other at the node N4 (center node). The node N4 is electrically connected between the resistor R41 and the resistor R42, and further between the other current terminal (second current terminal) of the transistor Tr71 and the other current terminal (second current terminal) of the transistor Tr72. In one embodiment, the transistor Tr71 has a structure identical to a structure of the transistor Tr72, and has dimensions equal to dimensions of the transistor Tr72, so that electrical characteristics of the transistor Tr71 becomes equal to electrical characteristics of the transistor Tr72. The load resistor R31 may have a resistance value equal to a resistance value of the load resistor R32. The resistor R41 may have a resistance value equal to a resistance value of the resistor R42.

The transistors Tr61 and Tr62 are cascode transistors and contribute to extension of high-frequency band of the differential transistor pair (the transistors Tr71 and Tr72). Control terminals of the transistors Tr61 and Tr62 are electrically connected to a bias terminal 17. The control terminals receive a bias voltage through the bias terminal 17. When the required high-frequency characteristics are relatively low with respect to high speed performance of the transistors Tr71 and Tr72, the transistors Tr61 and Tr62 may not be necessary. In such case, one current terminal (e.g., collector) of the transistor Tr71 is electrically connected to the power supply line 93 only through the load resistor R31, and one current terminal of the transistor Tr72 is electrically connected to the power supply line 93 only through load resistor R32.

A series resistance circuit 14 regulates a static current flowing through the differential pair circuit 13. The series resistance circuit 14 is electrically connected between the node N4 and the static potential line 94. That is, one end of the series resistance circuit 14 is electrically connected to the node N4, and the other end of the series resistance circuit 14 is electrically connected to the static potential line 94. The series resistance circuit 14 includes, for example, a line element 3 and a resistor R5 connected in series with the line element 3. Although the line element 3 is connected between resistor R5 and the node N4 as shown in the FIG. 4, the line element 3 may be connected between the resistor R5 and the static potential line 94. Therefore, the line element 3 and the resistor R5 may be replaced with each other.

The resistor R5 is, for example, a thin film resistor, or an injected resistance formed by implanting protons or the like into a semiconductor substrate. The resistor R5 is formed on a substrate (or in a substrate) common to the differential pair circuit 13. One end of the resistor R5 is electrically connected to the node N4 through the line element 3, and the other end of the resistor R5 is electrically connected to the static potential line 94. A resistance value of the resistor R5 is, for example, $0.5\Omega$ or more and $50\Omega$ or less. The line element 3 is connected in series with the resistor R5 between the node N4 and the static potential line 94. The line element 3 includes a signal line. The signal line is, for example, a straight line pattern formed on the same substrate as the differential pair circuit 13 is formed on.

Figure 5A:
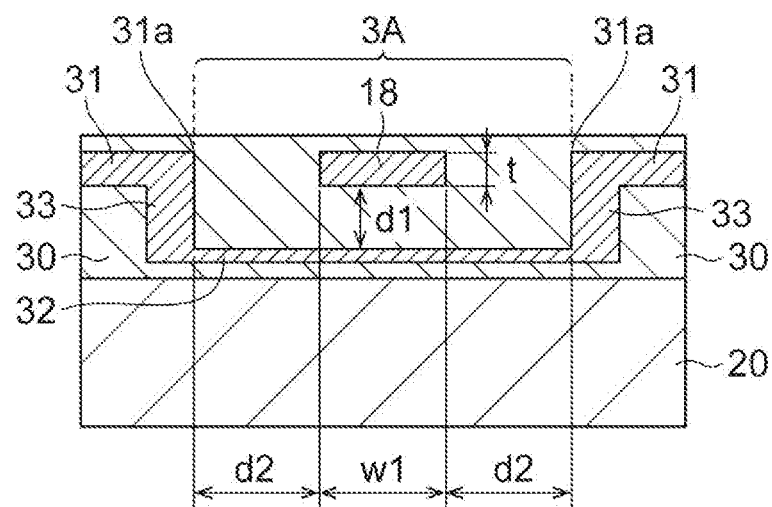
FIGS. 5A, 5B, and 5C are cross-sectional views showing line elements, which are examples of a line element, respectively, and show cross-sections perpendicular to extending direction of the line element.
Figure 5B:
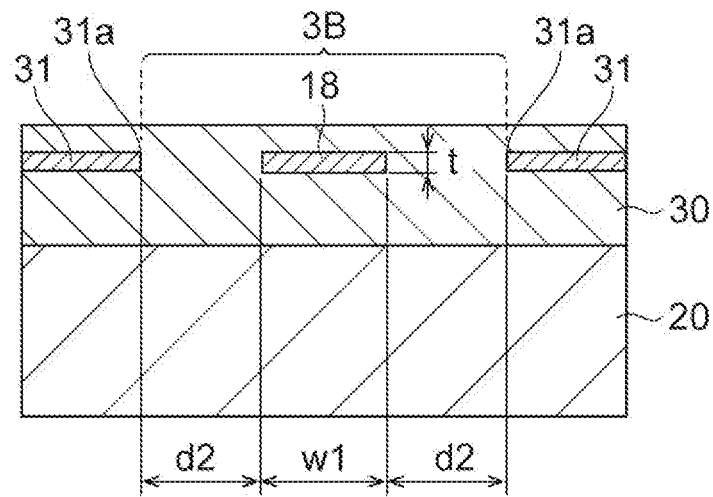
Figure 5C:
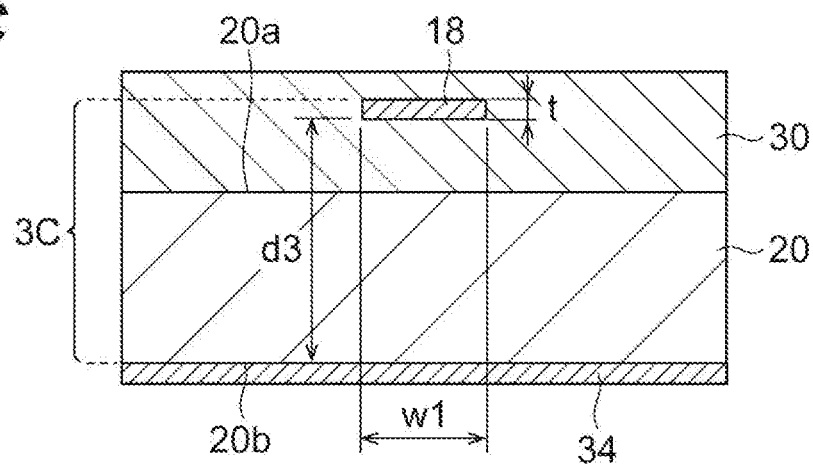
Figure 6:
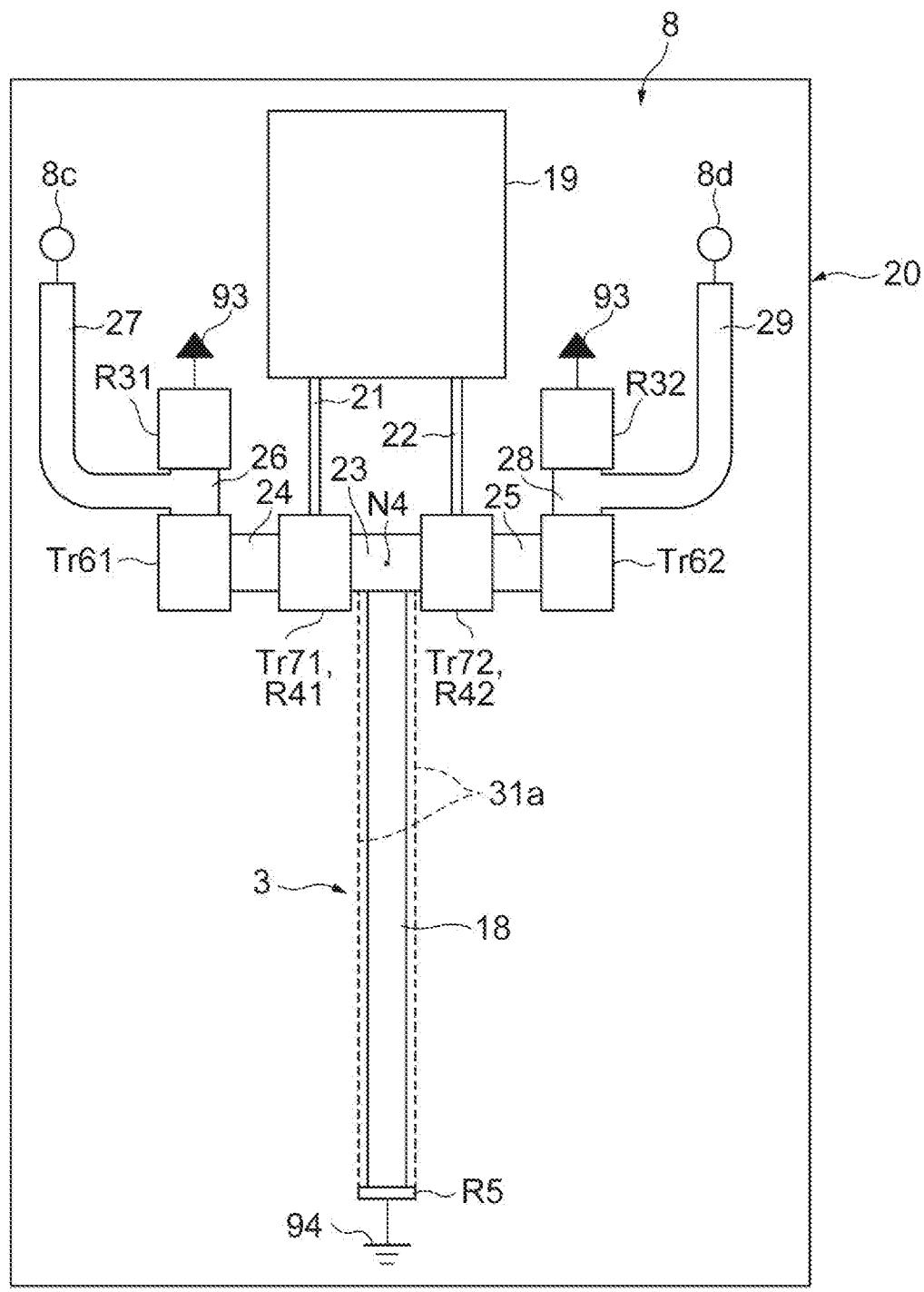
FIG. 6 is a plan view showing a differential amplifier circuit formed on a top side of a semiconductor substrate.

FIGS. 5A, 5B, and 5C are cross-sectional views showing the line element 3A, 3B, and 3C which are examples of the line element 3 of the differential amplifier circuit 8 according to the present embodiment. FIGS. 5A, 5B, and 5C show cross-sections perpendicular to an extending direction of the line element 3. Each of the line elements 3A, 3B, and 3C includes the signal line 18 having a certain line width w1. As shown in FIGS. 5A, 5B, and 5C, an insulating film 30 is provided on a semiconductor substrate 20, and the signal line 18 is embedded in the insulating film 30. Wiring lines 23 to 29 shown in FIG. 6 are also embedded in the insulating film 30. The semiconductor substrate 20 is made of, for example, semiconductor material such as gallium nitride (GaN), gallium arsenide (GaAs), or silicon (Si). The insulating film 30 is comprised of an inorganic or organic dielectric. The insulating film 30 is comprised of a silicon compound such as silica ($SiO_2$) or silicon nitride (SiN), in one embodiment. The insulating film 30, the signal line 18, and the wiring lines 23 to 29 constitute a wiring layer on the semiconductor substrate 20.

The signal line 18 of the line element 3A shown in FIG. 5A extends with a distance from a ground line 32 and a pair of ground lines 31. The ground lines 31 and 32 are connected to the static potential line 94 through a wiring line (not shown) and provide a reference potential (ground potential). The ground lines 31 are provided on the same wiring layer as the signal line 18 in the insulating film 30, and the ground line 32 is provided in a wiring layer located between the semiconductor substrate 20 and the wiring layer including the signal line 18 and the ground lines 31. The ground lines 31 extend along the signal line 18 with the signal line 18 therebetween. Between each ground line 31 and the signal line 18, a distance d2 is provided which is constant over the extending direction of the signal line 18. That is, the signal line 18 extends in one direction at a distance from the ground lines 31. The ground lines 31 extend in parallel to the signal line 18. The signal line 18 and the ground lines 31 may constitute a structure similar to a structure of so-called coplanar transmission line.

The ground line 32 is provided at a position facing the signal line 18 in the thickness direction (layer forming direction), in other words, at a position overlapping the signal line 18 when viewed from the top side in the thickness direction. However, the lateral width of the ground line 32 is larger than the width w1 of the signal line 18. In one instance, the lateral width of the ground line 32 is larger than the width (w1+d2×2), where d2 is a distance between the signal line 18 and the ground line 31 on either side of the signal line 18. The ground lines 31 may be connected to the ground line 32 through a plurality of vias 33 extending in the thickness directions in the insulating film 30. Between the ground line 32 and the signal line 18, there is a distance d1 which is constant over the extending direction of the signal line 18. That is, the signal line 18 extends straight in one direction at a distance from the ground lines 32. The signal line 18 and the ground lines 32 may constitute a structure similar to a structure of so-called microstrip line. The ground line 32 extends in parallel to the signal line 18.

The line element 3A has two design factors; a characteristic impedance Z0 and a delay time. The characteristic impedance Z0 is set to, for example, 25Ω or more and 200Ω or less. The delay time is set to, for example, 2 ps or more and 8 ps or less. The characteristic impedance Z0 and the delay time are determined primarily by relative dielectric constant $\varepsilon_r$ of the insulating film 30, line length of the signal line 18, thickness t of the signal line 18, the distance d1 between the signal line 18 and the ground line 32, the width w1 of the signal line 18, and the distance d2 between the signal line 18 and the ground lines 31 on either side thereof. When the insulating film 30 consists of $SiO_2$, the relative dielectric constant $\varepsilon_r$ of the insulating film 30 is 4.0. The line length of the signal line 18 is, for example, 500 μm or more. The thickness t of the signal line 18 is, for example, 3.0 μm. The distance d1 between the signal line 18 and the ground line 32 is, for example, 5.0 μm. The width w1 of the signal line 18 is, for example, 50 μm or less. The distance d2 between the signal line 18 and the ground lines 31 on both sides thereof is, for example, 10 μm.

The signal line 18 of the line element 3B shown in FIG. 5B extends with a certain distance from a pair of ground lines 31. The configuration of the ground lines 31 is the same as that shown in FIG. 5A except that the ground lines 31 are not connected to the ground line 32. That is, the signal line 18 and the ground lines 31 have a structure similar to a structure of so-called coplanar transmission line.

The characteristic impedance Z0 and delay time of the line element 3B are mainly determined by the relative dielectric constant $\varepsilon_r$ of the insulating film 30, the thickness t of the signal line 18, the line length of signal line 18, the width w1 of the signal line 18, and the distance d2 between the signal line 18 and the ground line 31 on both sides thereof. The relative dielectric constant $\varepsilon_r$ of the insulating film 30 is, for example, 4.0. The line length of the signal line 18 is, for example, 500 μm or more. The thickness t of the signal line 18 is, for example, 3.0 μm. The width w1 of the signal line 18 is, for example, 50 μm or less. The distance d2 between the signal line 18 and the ground line 31 on both sides thereof is, for example, 10 μm.

The signal line 18 of the line element 3C shown in FIG. 5C extends with a certain distance from the ground line 34 only. The ground line 34 is electrically connected to the static potential line 94 through a wiring line (not shown) and provides a reference potential (ground potential). The ground line 34 is provided not in the insulating film 30 but on the lower surface 20b of the semiconductor substrate 20, i.e. the surface facing away from the upper surface 20a on which the wiring layer is provided. In one instance, the ground line 34 is provided on the entire surface of the lower surface 20b. Between the ground line 34 and the signal line 18, there is a distance d3 which is constant over the extending direction of the signal line 18. That is, the signal line 18 extends straight in one direction with a distance from the ground line 34. The signal line 18 and the ground line 34 have a structure similar to a structure of so-called microstrip line. The ground line 34 extends in parallel to the signal line 18.

The characteristic impedance Z0 and delay time of the line element 3C are mainly determined by the relative dielectric constants $\varepsilon_r$ of the insulating film 30 and the semiconductor substrate 20, the thickness t of the signal line 18, the line length of the signal line 18, the width w1 of the signal line 18, and the distance d3 between the signal line 18 and the ground line 34. The relative dielectric constant $\varepsilon_r$ of the insulating film 30 is, for example, 4.0. When the semiconductor substrate 20 is made of silicon, the relative dielectric constant $\varepsilon_r$ of the semiconductor substrate 20 is 12.0. The line length of the signal line 18, for example, 500 μm or more. The thickness t of the signal line 18 is, for example, 3.0 μm. The width w1 of the signal line 18 is, for example, 50 μm or less. The distance d3 between the signal line 18 and the ground line 34 is, for example, 100 μm.

FIG. 6 is a plan view showing the differential amplifier circuit 8 formed on the top side of the semiconductor substrate 20. The differential amplifier circuit 8 has a circuit part 19 formed on the semiconductor substrate 20. The circuit part 19 includes the pre-buffer 9 and the emitter follower circuits 11 and 12 described above. From the circuit part 19, straight wiring lines 21 and 22 extend in parallel to each other. The straight wiring line 21 electrically connects the node N31 with the transistor Tr71, and the straight wiring line 22 electrically connects the node N32 with the transistors Tr72 (refer to FIG. 4).

As shown in FIG. 6, the transistor Tr61, the transistor Tr71, the transistor Tr72, and the transistor Tr62 are arranged in this order in a certain direction. That is, the transistors Tr61 and Tr62 are located on the outside of the transistors Tr71 and Tr72, and sandwiches the transistors Tr71 and Tr72 therebetween. The formation region of the transistor Tr71 may include the resistor R41, and the formation region of the transistor Tr72 may include the resistor R42.

A wiring line 23 shown in FIG. 6 is a wiring line electrically connecting the resistor R41 with the resistor R42, and has a center point in the extending direction of the wiring line 23. The center point corresponds to the node N4 (refer to FIG. 4). The wiring line 23 extends straight between the transistor Tr71 and the transistor Tr72. The signal line 18 is electrically connected to the wiring line 23 at the center point (the node N4) and extends from the wiring line 23 in one direction. The length of the signal line 18 is longer than those of the other wiring lines, for example, 500 μm or more. The ground lines 31 are also provided at a certain distance from the signal line 18, see FIGS. 5A and 5B. In FIG. 6, edges 31a of the ground lines 31 in FIGS. 5A and 5B are illustrated in dotted lines. The ground lines 31 may be included in a wide pattern or a solid filling of the ground potential. Further, although the ground lines 31 are illustrated in FIG. 6, a ground line different from the ground lines 31 may be provided depending on the configuration of the line element 3. In one embodiment, the signal line 18 has a thickness of 3 μm and a width of 10 μm perpendicular to the extending direction. One end of the resistor R5 is in contact with a distal end of the signal line 18, and the other end of the resistor R5 is electrically connected to the static potential line 94. Although the static potential line 94 may be provided as a wide pattern on the semiconductor substrate 20, a shape of the pattern is omitted in the drawing and the static potential line 94 is shown by the symbol.

A wiring line 24 is a wiring line that connects the transistor Tr61 and the transistor Tr71. A wiring line 25 is a wiring line that connects the transistor Tr62 and the transistor Tr72. The transistor Tr71 is sandwiched between the wiring line 24 and the wiring line 23. The transistor Tr72 is sandwiched between the wiring line 25 and the wiring line 23. In one instance, the wiring lines 24 and 25 are aligned in a line with the wiring line 23.

A wiring line 26 extends from the transistor Tr61 along a direction crossing a direction in which the wiring lines 23, 24 and 25 are aligned. A distal end of the wiring line 26 is in contact with one end of the load resistor R31. The load resistor R31 is, for example, a thin film resistor formed on the semiconductor substrate 20 or an injected resistor formed by implanting protons or the like onto the semiconductor substrate 20. The other end of the load resistor R31 is electrically connected to the power supply line 93. Although the power supply line 93 is provided as a wide pattern on the semiconductor substrate 20, a shape of the power supply line 93 is omitted in the drawing and the power supply line 93 is shown by the symbol. A wiring line 27 branches from a center point of the wiring line 26 in the extending direction, and a distal end of the wiring line 27 is electrically connected to the signal output terminal 8c.

A wiring line 28 extends from the transistor Tr62 along the same direction as the wiring line 26. A distal end of the wiring line 28 is in contact with the load resistor R32. The load resistor R32 is, for example, a thin film resistor formed on the semiconductor substrate 20 or an injected resistor formed by implanting protons or the like onto the semiconductor substrate 20. The other end of the load resistor R32 is electrically connected to the power supply line 93. A wiring line 29 branches from a center point of the wiring line 28 in the extending direction, and a distal end of the wiring line 29 is electrically connected to the signal output terminal 8d.

Referring back to FIG. 4, the differential pair circuit 13 receives the positive-phase component Vin3 and the negative-phase component VinB3, which constitute the differential input signal, at the respective control terminals of the transistors Tr71 and Tr72, and generates a differential output signal (a positive-phase component Vin4 and a negative-phase component VinB4) at the load resistors R31 and R32. The differential output signal is a drive signal in accordance with the differential input signal.

Specifically, when the negative-phase component VinB3 turn on the transistor T71 and the positive-phase component Vin3 turns off the transistor T72, the current Ia flows through the load resistor R31, the transistor Tr61, the transistor Tr71, and the resistor R41. The magnitude of the current Ia is determined by the series resistance circuit 14, i.e. impedance of the resistor R5 and the line element 3, and voltage value of the positive-phase component Vin3. At this time, the potential of the node N51 between the load resistor R31 and the transistor Tr61 becomes lower by the voltage drop of the load resistor R31 than the supply voltage provided through the power supply line 93. When the positive-phase component Vin3 turns on the transistor Tr72 and the negative-phase component VinB3 turns off the transistor Tr71, the current Ia flows through the load resistor R32, the transistor Tr62, the transistor Tr72, and the resistor R42. At this time, the potential of the node N52 between the load resistor R32 and the transistor Tr62 becomes lower by the voltage drop of the load resistor R32 than the supply voltage. Since the positive-phase component Vin3 and the negative-phase component VinB3 complimentarily changes, the potentials of the nodes N51 and N52 also complimentarily changes.

Thus, the positive-phase component Vin4 and the negative-phase component VinB4 are output from the nodes N51 and N52 to the outside of the output buffer 10 through the signal output terminals 8c and 8d. The positive-phase component Vin4 and the negative-phase component VinB4 are provided as the differential output signal to the optical modulator 6, see FIG. 1. Although the differential output signal (the positive-phase component Vin4 and the negative-phase component VinB4) is output as a drive signal in the present embodiment, only one of the positive-phase component Vin4 and the negative-phase component VinB4 may be used as a drive signal for the optical modulator 6.

Figure 7:
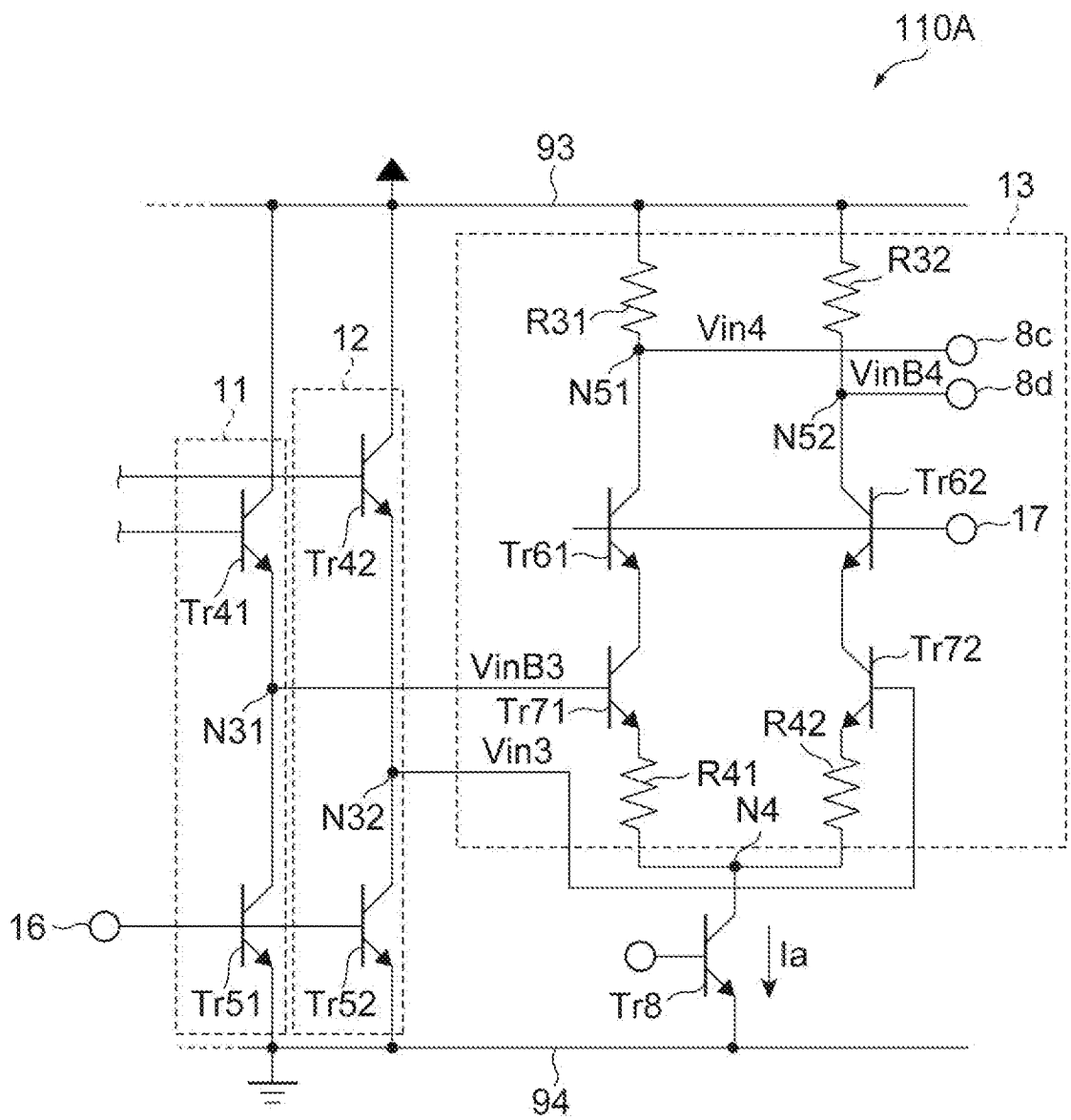
FIG. 7 is a schematic diagram showing a configuration of an output buffer according to a first comparative example.

Advantages obtained by the driving circuit 7 according to the present embodiment described above will be described in comparison with comparative examples. FIG. 7 is a schematic diagram showing a configuration of an output buffer 110A according to a first comparative example. The output buffer 110A differs from the output buffer 10 of the present embodiment (see FIG. 4) in that a transistor Tr8 is provided instead of the series resistance circuit 14. That is, in the output buffer 110A, when the negative-phase component VinB3 turns on the transistor Tr71 and the positive-phase component Vin3 turns off the transistor Tr72, the current Ia with the magnitude defined by the transistor Tr8 flows through the load resistor R31, the transistor Tr61, the transistor Tr71, and the resistor R41. When the positive-phase component Vin3 turns on the transistor Tr72 and the negative-phase component VinB3 turns off the transistor Tr71, the current Ia with the magnitude defined by the transistor Tr8 flows through the load resistor R32, the transistor Tr62, the transistor Tr72, and the resistor R42. Then, the positive-phase component Vin4 and the negative-phase component VinB4 generated by the voltage drops of the load resistors R31 and R32 are output from the nodes N51 and N52.

The output buffer 110A is required to meet large output amplitude as well as lower power consumption. A portion between 60% and 90% of the power consumption of the output buffer 110A is consumed by the differential pair circuit 13 and the transistor Tr8. The relation between the power consumption and the output amplitude of the differential pair circuit 13 and transistor Tr8 is expressed by an equation (1) below, where Voutpp is the output amplitude, Rout is a resistance value of the load resistors R31 and R32, Rload is a resistance value of a load resistor in the optical modulator 6, Vcc is the supply voltage of the power supply line 93. Voutlow is a lower limit of the supply voltage at which the differential pair circuit 13 can operate, and specifically, corresponds to a sum of respective on-voltages of the transistor Tr61, transistor Tr71, and the transistor Tr8 (or the transistor Tr62, the transistor Tr72, and the transistor Tr8) which are connected in series in this order. Vonhbt is an on-voltage of HBTs used in the output buffer 110A. Pdiss is a power consumption in the differential pair circuit 13 and the transistor Tr8.

[Equation 1]

$$Voutpp = \frac{Rout \cdot Rload}{Rout + Rload} \cdot Ia \quad (1)$$
$$Vcc = Voutpp + Voutlow \cong Voutpp + 3 \cdot Vonhbt$$
$$Pdiss = Ia \cdot Vcc$$

For example, assuming that Voutpp=1.5 Vpp, Rout=Rload=50Ω, Vonhbt=0.8 V, we obtain Ia=60 mA, Vcc=3.9 V, and Pdiss=234 mW.

Figure 8:
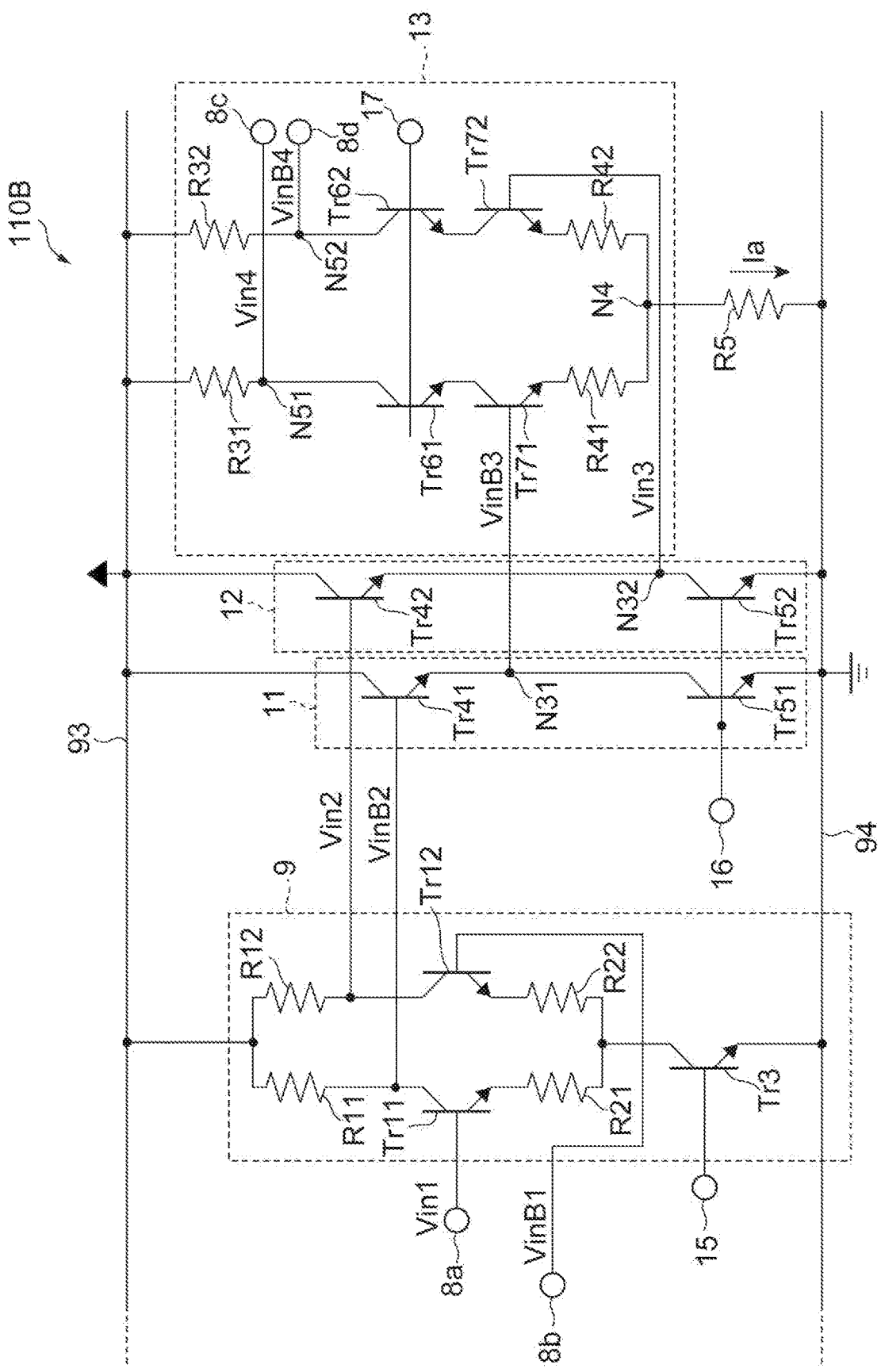
FIG. 8 is a circuit diagram showing the configuration of an output buffer according to a second comparative example.

FIG. 8 is a circuit diagram showing the configuration of the output buffer 110B according to the second comparative example. The output buffer 110B has the resistor R5 instead of the transistor Tr8 of the output buffer 110A to reduce power consumption. In the output buffer 110B, when the negative-phase component VinB3 turns on the transistor Tr71 and the positive-phase component Vin3 turn off the transistor Tr72, a current Ia with magnitude defined by the resistance value of the resistor R5 and a voltage value of the positive-phase component Vin3 flows through the load resistor R31, the transistor Tr61, the transistor Tr71, and the resistor R41. When the positive-phase component Vin3 turns on the transistor Tr72 and the negative-phase component VinB3 turns off the transistor Tr71, a current Ia with the magnitude defined by the resistance value of the resistor R5 and a voltage value of the negative-phase component VinB3 flows through the load resistor R32, the transistor Tr62, the transistor Tr72, and the resistor R42. Then, the positive-phase component Vin4 and the negative-phase component VinB4 generated by the voltage drop of the load resistors R31 and R32 are output from the nodes N51 and N52.

In the output buffer 110B, for example, when the current value of the current Ia is 60 mA and the resistance value Rcs of the resistor R5 is 1.7Ω, the power consumption of the differential pair circuit 13 and the resistor R5 is 192 W. Therefore, the power consumption can be reduced from Pdiss=234 mW of the output buffer 110A shown in FIG. 7.

However, when the output buffer 110B shown in FIG. 8 is applied to a plurality of the differential amplifier circuits 8 shown in FIG. 2, some disadvantages are caused as described below. The following equation (2) shows the relation between a base-emitter voltage of a HBT and an emitter current corresponding to the output current, where $V_{be}$ is base-emitter voltage [V], $I_e$ is emitter current [A], $I_0$ is saturation current [A], n is ideality factor, k is Boltzmann constant (8.6×10$^{-5}$ eV/K), T is absolute temperature [K], and q is electron mass (1.6×10$^{-19}$ coulomb).

[Equation 2]

$$V_{be} = \frac{nkT}{q} \cdot \ln\left(\frac{I_e}{I_0}\right) \quad (2)$$

Thus, the relation between the base-emitter voltage and the emitter current is exponential and nonlinear. That is, the transistors Tr71 and Tr72 have such nonlinear characteristics. Accordingly, even if the positive-phase component Vin3 and the negative-phase component VinB3 constitute an ideal differential signal, a higher harmonic signal with a frequency twice the frequency of the differential signal is generated in the node N4. A voltage waveform of the higher harmonic signal applied to the resistor R5 modulates the current Ia.

FIGS. 9A, 9B, and 9C are graphs for briefly explaining such phenomena. FIG. 9A shows the relation between the differential input signal (difference between the positive-phase component Vin3 and the negative-phase component VinB3) and the collector current Ic of the transistors Tr71 and Tr72. In FIG. 9A, the horizontal axis represents the voltage value [V] of the differential input signal, and the vertical axis represents the collector current Ic [mA]. The curve G11 represents the collector current Ic1 of the transistor Tr71, and the curve G12 represents the collector current Ic2 of the transistor Tr72. The curve G13 represents a sum of the collector current Ic1 and the collector current Ic2.

Here, as shown in FIG. 9B, when a periodic voltage waveform Wv is input as the differential input signal, a current waveform Wi shown in FIG. 9C is generated by the relation shown in the curve G13. The current waveform Wi has twice the frequency of the voltage waveform Wv. The current Ia with the current waveform Wi flows through the resistor R5. It is noted that, in FIGS. 9A to 9C, for simplicity of explanation, the resistance value of the resistor R5 is assumed to be 0Ω.

When the current Ia is modulated at a frequency twice the frequency of the differential input signal as described above, the current flowing through the power supply line 93 is modulated at the same frequency. The modulated current flowing through the power supply line 93 is converted into a modulated voltage by a parasitic inductance of the power supply line 93. The modulated voltage occurred in one of the differential amplifier circuits 8 spreads to the other differential amplifier circuits 8 through the power supply line 93. Thus, the modulated voltage causes crosstalk noise in the other differential amplifier circuits 8.

Figure 10:
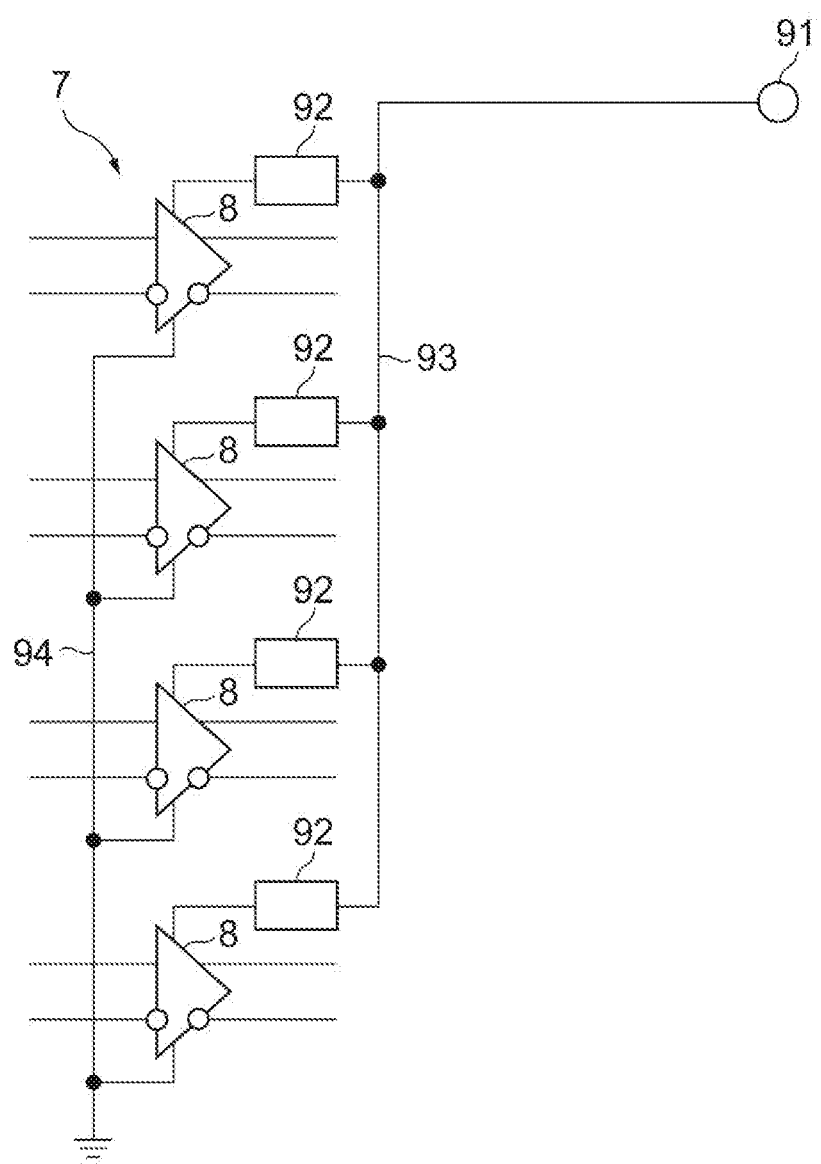
FIG. 10 is a diagram in which a filter circuit is provided to each of differential amplifier circuits in order to suppress crosstalk noise.

Here, in order to suppress such crosstalk noise, as shown in FIG. 10, a filter circuit 92 is conventionally provided for each of the N differential amplifier circuits 8 (N=4 in FIG. 10). However, the N differential amplifier circuits 8 need the N filter circuits 92 and more circuit area therefor. Increase in the circuit area of the driving circuit may be disadvantage with respect to cost down and downsizing of the optical transmitter module.

In order to avoid the disadvantage, in the differential amplifier circuit 8 according to the present embodiment, the line element 3 is provided in series with the resistor R5 in the series resistance circuit 14 between the node N4 and the static potential line 94. The line element 3, as shown in FIGS. 5A to 5C and FIG. 6, has the signal line 18 extending straight in one direction with a certain distance (spacing) from the ground lines 31 which sandwiches the signal line 18 and/or the ground line 32 (34) which extends in the same direction in a layer lower than the layer of the signal line 18. The line element 3 forms a structure similar to a transmission line such as a coplanar line or a microstrip line.

Figure 11:
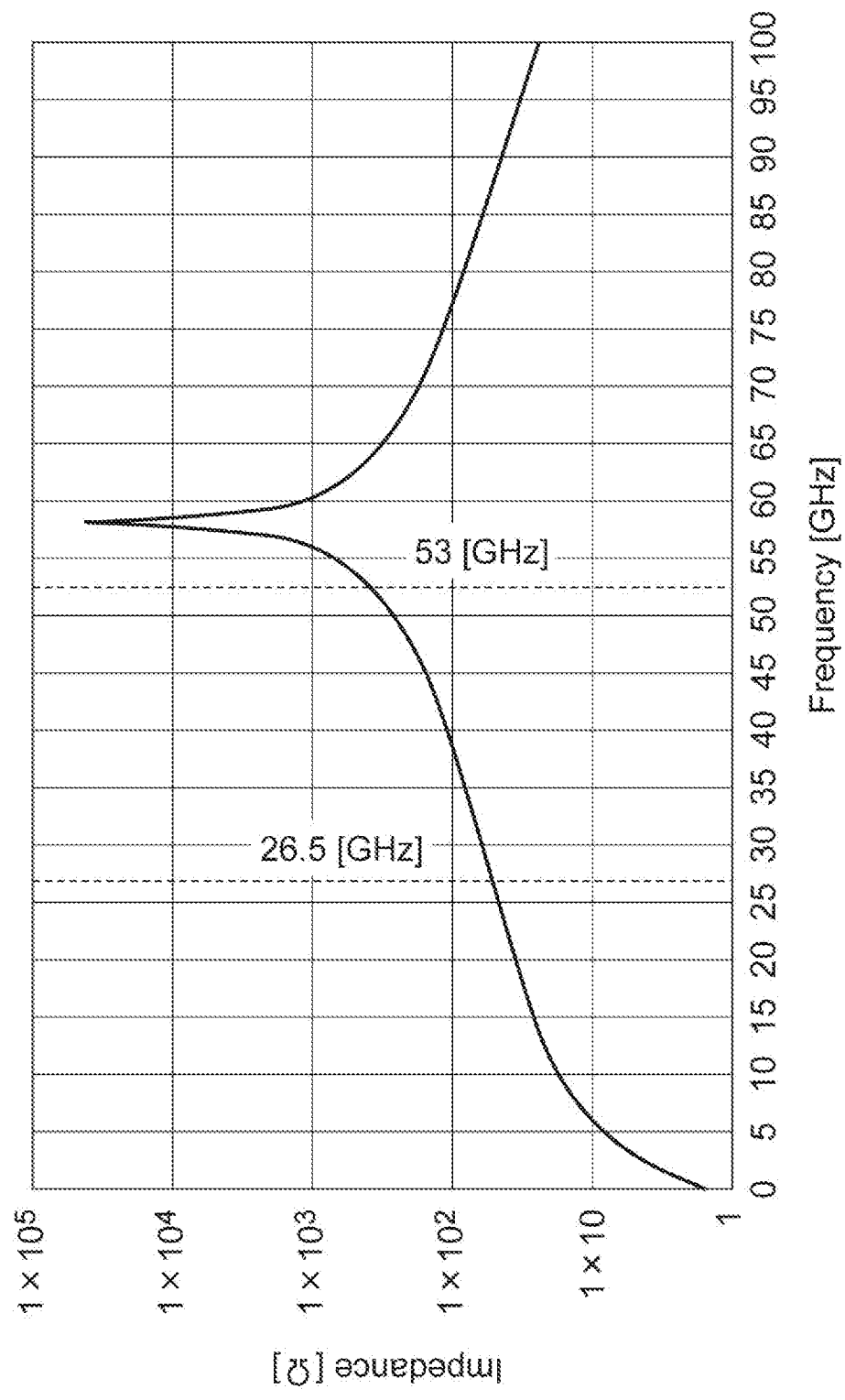
FIG. 11 is a graph showing a result of impedance-frequency characteristics of a series resistance circuit by circuit simulation.

FIG. 11 is a graph showing a simulation result of impedance-frequency characteristics of the series resistance circuit 14 when the characteristic impedance Z0 of the line element 3 is 55Ω and the delay time of the line element 3 is 4.4 ps. In FIG. 11, the horizontal axis represents the frequency [GHz] of the differential input signal and the vertical axis represents the impedance [Ω] of the line element 3. Here, the resistance value Rcs of the resistor R5 is 1.5Ω. As shown in FIG. 11, the impedance increases as the frequency increases from zero and reaches a peak at a certain frequency. In this case, the peak exists at a frequency around 57 GHz. Specifically, the line element 3 corresponds to a λ/4 line in the vicinity of 57 GHz by the following equation (3). That is, when viewed from one end (the node N4 side) of the line element 3, the other end (the static potential line 94 side) appears to be open in the vicinity of 57 GHz. Therefore, the impedance has the peak near at 57 GHz calculated by the following equation (3).

[Equation 3]

$$\frac{1}{4 \cdot 4.4 \times 10^{-12} \text{ (s)}} = 57 \times 10^9 \text{ (Hz)} \quad (3)$$

For example, the fundamental frequency of the electrical incoming signal of 53 GBaud is 26.5 GHz (a half of a symbol rate, or a half of a signal rate) and the second harmonic appears around 53 GHz. In the case of FIG. 11, since the impedance around 53 GHz becomes relatively high, i.e., about 200Ω or more, a modulated current of the second harmonic can be suppressed. As a result, the crosstalk noise described above can be reduced.

As the line element 3 where the characteristic impedance Z0 is 55Ω and the delay time is 4.4 ps, the line element 3A shown in FIG. 5A is available by determining the key factors as;
Relative dielectric constant $\varepsilon_r$ of the insulating film 30: 4.0 (e.g. $SiO_2$),
Line length of the signal line 18: 800 μm,
Thickness t of the signal line 18: 3.0 μm,
Spacing d1 between the signal line 18 and the ground line 32: 5.0 μm,
Width w1 of the signal line 18: 7.0 μm,
Spacing d2 between the signal line 18 and the ground line 31 on either sides: 10 μm.

Next, simulation results for the case that the driving circuit 7 includes only two of the differential amplifier circuits 8 (FIG. 4) according to the present embodiment will be described in comparison with the differential amplifier circuit (FIG. 8) of the comparative example. Then, a PAM4 signal of 53 GBaud was input to one of the differential amplifier circuits 8, and crosstalk nose occurring in the other of the differential amplifier circuits 8 was confirmed.

Figure 12:
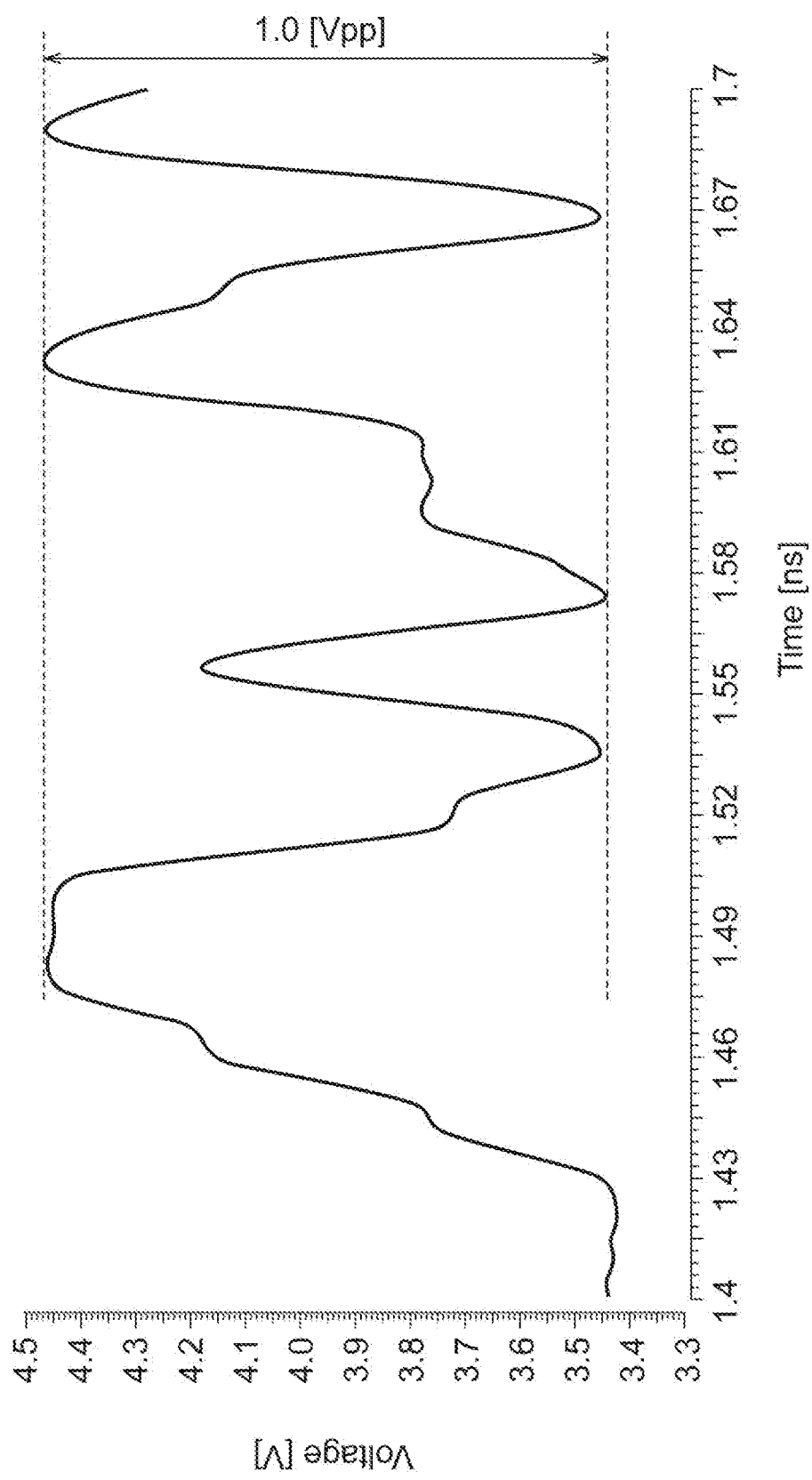
FIG. 12 is a graph showing an output waveform of a differential amplifier circuit to which a PAM4 signal is input.

FIG. 12 is a graph showing an output waveform of the one of the differential amplifier circuits 8 to which the PAM4 signal is input. In FIG. 12, the horizontal axis represents time [ns], and the vertical axis represents an output voltage [V]. Only one of the positive component and the negative component of the differential signal output from the differential amplifier circuit is shown. As shown in FIG. 12, the waveform having a peak-to-peak amplitude of 1.0 V is output from the one of the differential amplifier circuits 8.

Figure 13:
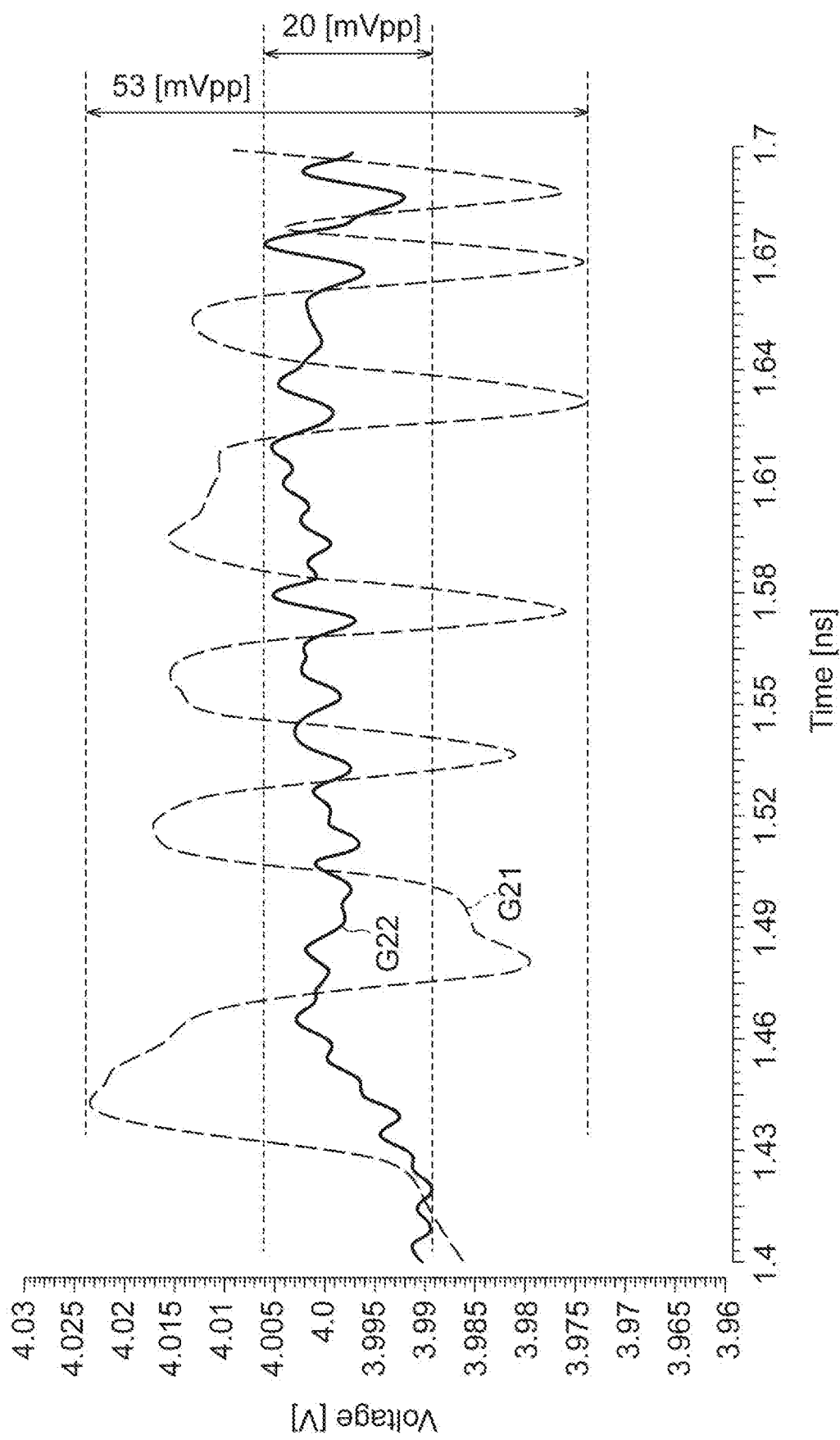
FIG. 13 is a graph showing output waveforms of the other differential amplifier circuit.

FIG. 13 is a graph showing output waveforms of the other of the differential amplifier circuit 8. In FIG. 13, the horizontal axis represents time [ns], and the vertical axis represents the output voltage [V]. Further, the waveform G21 shows a result of the comparative example (FIG. 8), and the waveform G22 shows a result of the present embodiment (FIG. 4). Since no signals is input to the other of the differential amplifier circuit 8, only crosstalk noise is observed in the output waveforms. As shown in FIG. 13, although crosstalk noise having a peak-to-peak value of 53 mV appeared in the comparative example (waveform G21), the peak-to-peak value of the crosstalk noise in the present embodiment (waveform G22) was reduced to 20 mV. As described above, in the present embodiment, the crosstalk noise was reduced by about 8 dB in comparison with the comparative example.

The advantages obtained by the driving circuit 7 according to the present embodiment are briefly described as follows. In the driving circuit 7 of the present embodiment, the line element 3 is connected in series with the resistor R5 between the node N4 and the static potential line 94. The line element 3 includes the signal line 18, and the signal line 18 extends straight in one direction with a distance from ground lines (ground lines 31, 32, and 34 shown in FIGS. 5A to 5C). That is, the line element 3 has a structure similar to a so-called transmission line. In this case, the impedance characteristics of the series resistance circuit 14 as viewed from the node N4 side depend on the frequency of the current flowing through the series resistance circuit 14, and as shown in FIG. 11, are lowest when the frequency is zero (i.e., direct current), and have a peak at a certain frequency. On the other hand, as described above, in each differential amplifier circuit 8, a noise current having a frequency twice the fundamental frequency of each differential input signal (hereinafter, referred to as noise frequency) flows through the differential pair circuit 13 thereof, thereby fluctuating the supply voltage provided to the differential pair circuit 13 through the power supply line 93. In the driving circuit 7 according to the present embodiment, the increased impedance (maximized impedance) of the series resistance circuit 14 at the noise frequency prevents the noise current from flowing through the differential pair circuit 13, and allows the fluctuation of the supply voltage to be suppressed.

In the embodiment, impedance of the series resistance circuit 14 viewed from the node N4 side at the noise frequency, e.g., 53 GHz, may be larger than the resistance value of the resistor R5. For example, such a configuration can effectively reduce noise current flowing through the differential pair circuit 13. In addition, in this case, an impedance of the series resistance circuit 14 viewed from the node N4 side at the noise frequency (e.g., 53 GHz) may be larger than 10 or 20 times of the resistance value of the resistor R5. For example, such a configuration can preferably reduce the noise current flowing through the differential pair circuit 13.

In the embodiment, the impedance of the series resistance circuit 14 viewed from the node N4 side at the noise frequency (e.g., 53 GHz) may be larger than the impedance of the series resistance circuit 14 viewed from node N4 side at the fundamental frequency (e.g., 26.5 GHz). In this instance, the noise current can be effectively reduced with suppressing a reduction in magnitude of the differential output signal output from the differential pair circuit 13.

In the embodiment, an example in which the fundamental frequency is 26.5 GHz has been described above, but the fundamental frequency may be 15 GHz or more and 60 GHz or less. In this instance, quality of the optical outgoing signal can be improved for high-speed optical communication systems.

In the embodiment, impedance of the series resistance circuit 14 viewed from the node N4 side in the noise frequency may be 100Ω or more. Here, a DC-like common-mode resistance value existing between the emitter of the transistor Tr41 (Tr42) and the static potential line 94 is calculated as follows. That is, assuming that the emitter resistance of the transistor Tr41 (Tr42) is 3Ω and the resistance value of the resistance R41 (R42) is 5Ω, the respective common-mode resistances thereof become 1.5Ω and 2.5Ω, respectively, because they appear to be halved. When the resistance value of the resistor R5 is 1.5Ω, a sum of the common-mode resistance 1.5Ω of the transistor Tr41 (Tr42), the common-mode resistance 2.5Ω of the resistor R41 (R42), and the resistor value 1.5Ω of the resistor R5 is, for example, 5.5Ω. On the other hand, when the impedance (100Ω) of the series resistance circuit 14 at 53 GHz is added to the sum, the impedance (current source impedance) between the emitter transistor Tr41 (Tr42) and the static potential line 94 is approximately 20 times as large as that without the line element 3. That is, the noise current can be reduced to approximately 1/20 in comparison with the comparative example. Therefore, the noise current flowing through the differential pair circuit 13 can be effectively reduced.

Figure 14:
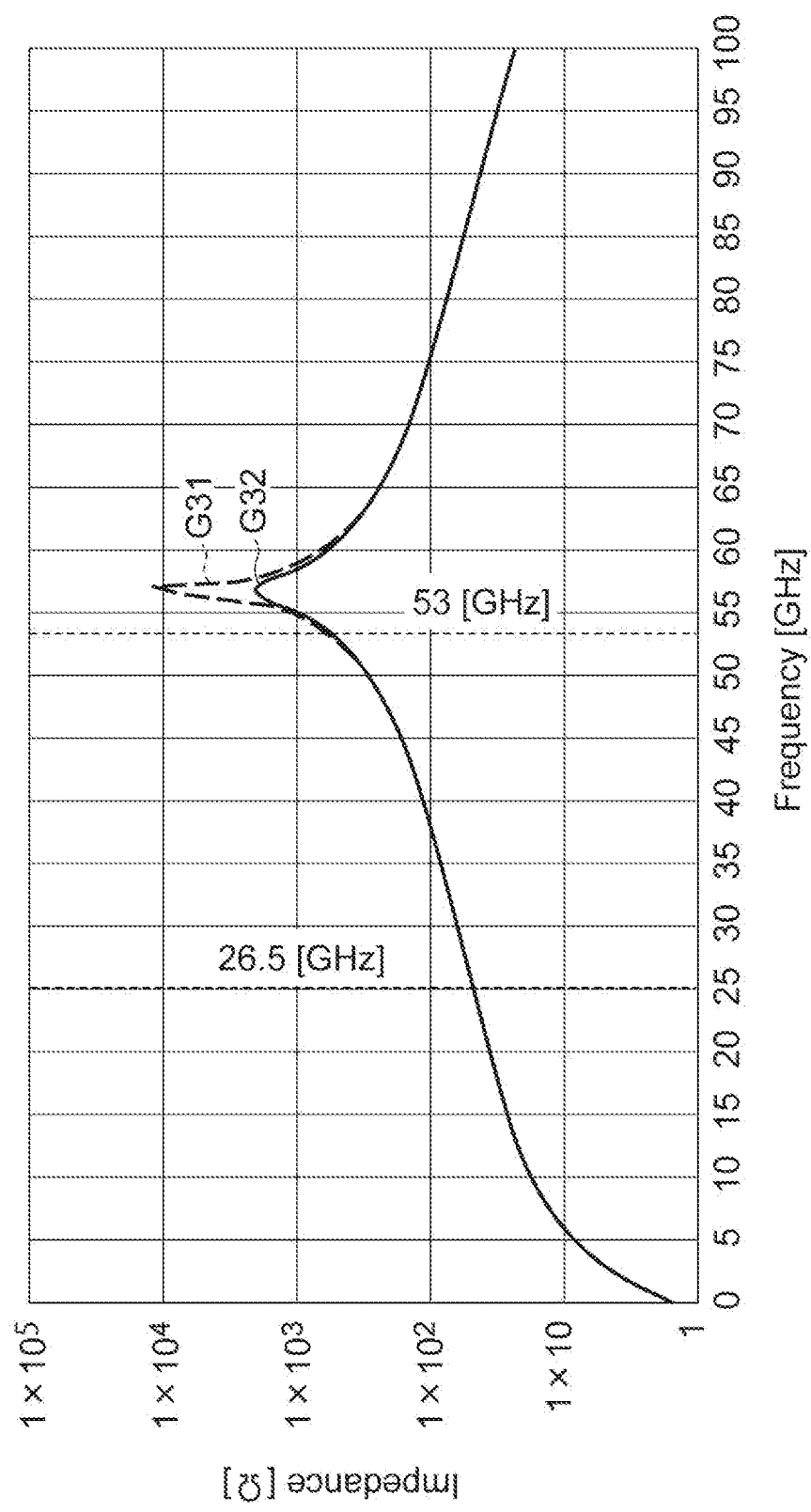
FIG. 14 is a graph showing a difference in impedance-frequency characteristics of a series resistance circuit according to an arrangement of a signal line and a resistor.

FIG. 14 is a graph showing a difference in impedance-frequency characteristics of the series resistance circuit 14 according to the order of connecting the signal line 18 and the resistor R5 between the node N4 and the static potential line 94. In FIG. 14, the horizontal axis represents the frequency [GHz] of the differential input signal and the vertical axis represents an impedance [Ω]. In addition, the curve G31 represents a case in which the signal line 18 is connected between the resistor R5 and the node N4 (see FIG. 4), and the curve G32 represents a case in which the signal line 18 is connected between the resistor R5 and the static potential line 94. In the embodiment, for example, the resistance value of the resistor R5 is 1.5Ω, the characteristic impedance Z0 of the line element 3 is 55Ω, and the delay time of the line element 3 is 4.4 ps.

Referring to FIG. 14, it can be seen that the peak impedance values in the impedance-frequency characteristics of the series resistance circuit 14 differs depending on the order in which the resistor R5 and the line element 3 are connected between the node N4 and the static potential line 94. Specifically, the peak impedance in the case where the line element 3 is connected to the node N4 side and the resistor R5 is connected to the static potential line 94 side is larger than the peak impedance in the case where the line element 3 is connected to the static potential line 94 side and the resistor R5 is connected to the node N4 side. Also at the noise frequency (53 GHz), the impedance value is slightly higher when the line element 3 is connected to the node N4 side and the resistor R5 is connected to the static potential line 94 side. That is, since the line element 3 is connected between the node N4 and the resistor R5, the impedance of the series resistance circuit 14 at the noise frequency viewed from the node N4 side can be further increased, and the noise current flowing through the differential pair circuit 13 can be more effectively reduced.

Figure 15:
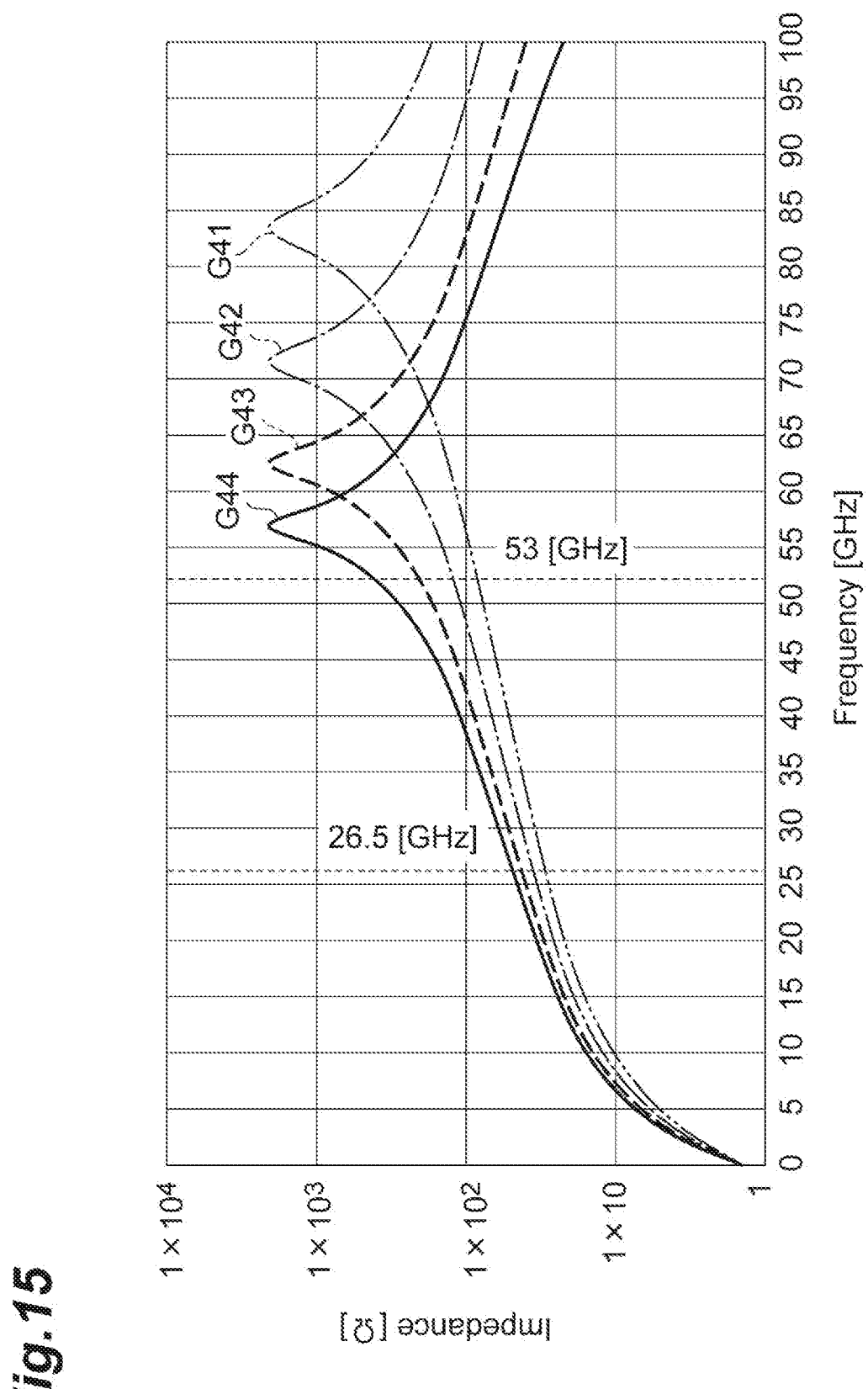
FIG. 15 is a graph showing a difference in impedance-frequency characteristics of a series resistance circuit according to a delay time of a signal line.

FIG. 15 is a graph showing differences in the impedance frequency characteristics of the series resistance circuit 14 with respect to the delay time of the line element 3. In FIG. 15, the horizontal axis represents the frequency [GHz] of the differential input signal and the vertical axis represents the impedance [Ω] of the line element 3. The curves G41, G42, G43, and G44 represent results where the delay times of the line element 3 are 3.0 ps, 3.5 ps, 4.0 ps, and 4.4 ps, respectively. In the embodiment, the resistance value of the resistor R5 is, for example, 1.5Ω, and the characteristic impedance Z0 of the line element 3 is, for example, 55Ω.

Referring to FIG. 15, it can be seen that the peak frequency in the impedance-frequency characteristics of the series resistance circuit 14 changes depending on the delay time of the line element 3. Specifically, the larger the delay time of the line element 3, the smaller the peak frequency. In this instance, the peak frequency of either delay time is larger than the noise frequency 53 GHz. An increase in the delay time allows the peak frequency to approach the noise frequency (e.g., 53 GHz) with increasing the impedance value at the peak frequency. Thus, a larger delay time can more effectively reduce the noise current flowing through the differential pair circuit 13. For example, in order to set the impedance value at the noise frequency 53 GHz to 100Ω or more, when the characteristic impedance Z0=55Ω is given, the delay time should be 3.5 ps or more.

An exemplary structure of the line element 3 in which the characteristic impedance Z0 is 55Ω and delay time is 3.5 ps is available by varying the line length of the line element 3 from 800 μm to 600 μm in the above-described specific example (FIG. 5A) in which the characteristic impedance Z0 is 55Ω and the delay time is 4.4 ps.

Figure 16:
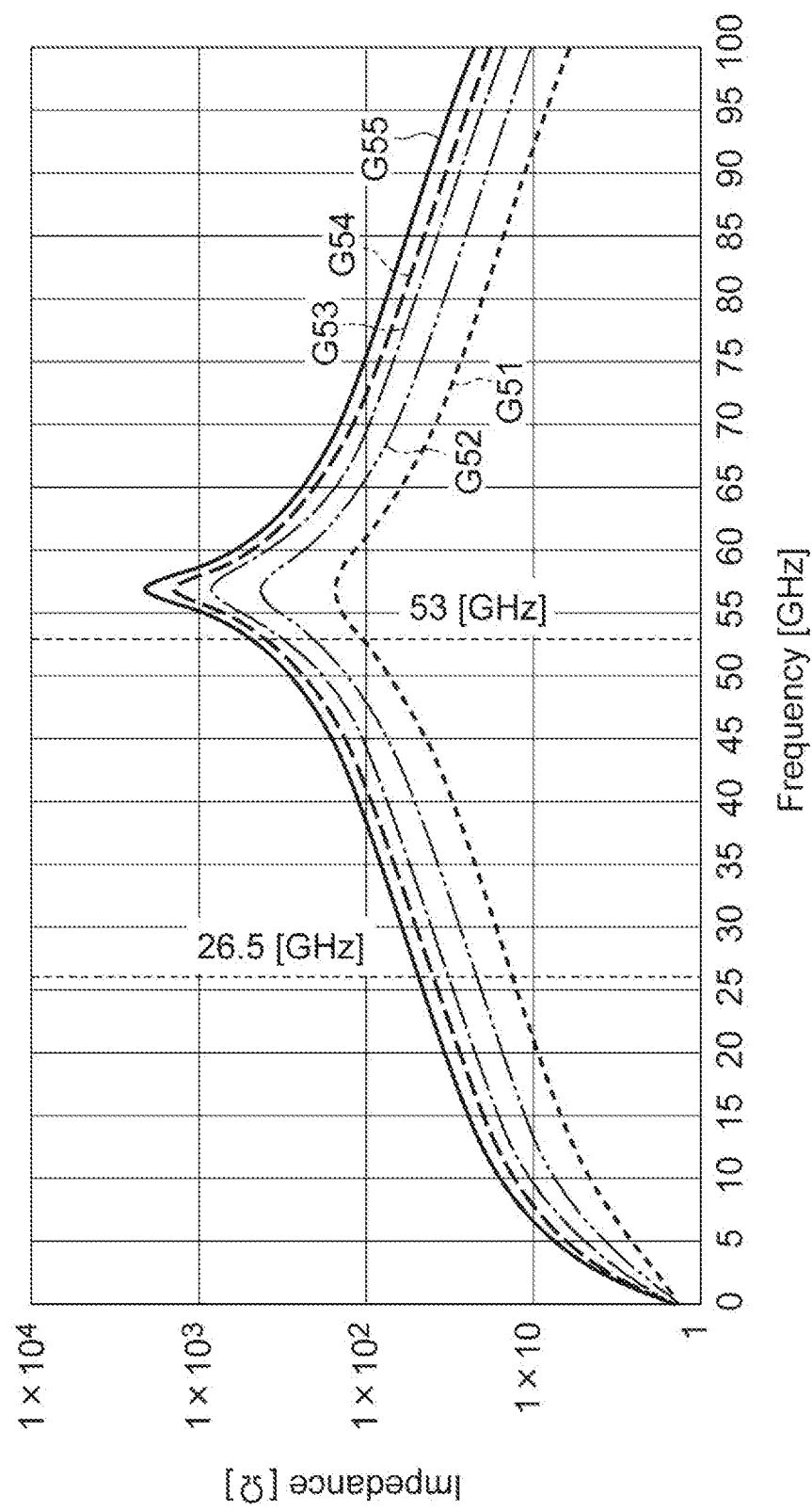
FIG. 16 is a graph illustrating dependence of impedance-frequency characteristics of a series resistance circuit on characteristic impedance of a signal line.

FIG. 16 is a graph illustrating dependence of the impedance frequency characteristics of the series resistance circuit 14 on the characteristic impedance Z0 of the line element 3. In FIG. 16, the horizontal axis represents the frequency [GHz] of the differential input signal, and the vertical axis represents the impedance [Ω] of the line element 3. The curves G51, G52, G53, G54, and G55 denote cases where the characteristic impedance Z0 of the line element 3 is 15Ω, 25Ω, 35Ω, 45Ω, and 55Ω, respectively. In the embodiment, the resistance value of the resistor R5 is 1.5Ω, and the delay time of the line element 3 is 4.4 ps.

Referring to FIG. 16, it can be seen that the peak impedance in the impedance-frequency characteristics of the series resistance circuit 14 depends on the characteristic impedance Z0 of the line element 3. Specifically, the larger the characteristic impedance Z0 of the line element 3, the larger the peak impedance. Then, the larger the peak impedance, the larger the impedance at the noise frequency 53 GHz. Therefore, a larger characteristic impedance Z0 of the line element 3 can effectively reduce the noise current flowing through the differential pair circuit 13. For example, in order to set the impedance at the noise frequency 53 GHz to 100Ω or more, when the delay time of 4.4 ps is given, the characteristic impedance Z0 should be 15Ω or more.

As the line element 3 where the characteristic impedance Z0 is 15Ω and the delay time is 4.4 ps, the line element 3A shown in FIG. 5A is available by determining the key factors as:

Relative dielectric constant $\varepsilon_r$ of the insulating film 30: 4.0 (e.g., $SiO_2$),
Line length of the signal line 18: 710 μm,
Thickness t of the signal line 18: 3.0 μm,
Spacing d1 between the signal line 18 and the ground line 32: 5.0 μm,
Width w1 of the signal the line 18: 50 μm,
Spacing d2 between the signal line 18 and the ground line 31 on either side: 10 μm.

In the line element 3B shown in FIG. 5B and the line element 3C shown in FIG. 5C, respective characteristic impedances Z0 and respective delay times can be varied. For example, in the line element 3B shown in FIG. 5B, in order to set the characteristic impedance Z0 to 78Ω and the delay time to 4.4 ps, the key factors are determined as follows:
Relative dielectric constant $\varepsilon_r$ of the insulating film 30: 4.0 (e.g., $SiO_2$),
Line length of the signal line 18: 880 μm,
Thickness t of the signal line 18: 3.0 μm,
Width w1 of the signal line 18: 10 μm,
Spacing d2 between the signal line 18 and the ground line 31 on either sides: 10 μm.

Further, for example, in the line element 3C shown in FIG. 5C, in order to set the characteristic impedance Z0 to 90Ω and the delay time to 4.4 ps, the key factors are determined as follows:

Relative dielectric constant $\varepsilon_r$ of the insulating film 30: 4.0 (e.g., $SiO_2$),
Relative dielectric constant $\varepsilon_r$ of the semiconductor substrate 20: 12.0 (e.g., Si),
Line length of the signal line 18: 510 μm,
Thickness t of the signal line 18: 3.0 μm,
Width w1 of the signal line 18: 10 μm,
Spacing d3 between the signal line 18 and the ground line 34: 100 μm.

The driving circuit according to the present disclosure is not limited to the above-described embodiments, and various other modifications can be made. For example, in the above embodiment, the structure of the line element 3 has been exemplified as shown in FIGS. 5A to 5C, however, the structure of the line element 3 is not limited to these, as long as the structure of the line element provides a similar characteristics to the impedance-frequency characteristics as shown in FIGS. 14 to 16. The line element 3 needs a circuit area smaller than a circuit area of the filter circuit which generally needs a large capacitor and a large inductor. Therefore, A small circuit area of the series resistance circuit 14 may be an advantage with respect to cost down and downsizing of the optical transmitter module.

While various exemplary embodiments have been described above, various omissions, substitutions, and changes may be made without being limited to the exemplary embodiments described above. It is also possible to combine elements in different embodiments to form other embodiments.

From the foregoing description, it will be appreciated that various embodiments of the present disclosure have been described herein for purposes of description and that various changes may be made without departing from the scope and spirit of the disclosure. Accordingly, the various embodiments disclosed herein are not intended to be limiting, with a true scope and spirit being indicated by the appended claims.

What is claimed is:

1. A driving circuit comprising:
a plurality of differential amplifier circuits each electrically connected to a power supply line, and each differential amplifier circuit including a differential pair circuit and a series resistance circuit,
wherein the differential pair circuit includes:
a first load resistor,
a second load resistor,
a first transistor having a control terminal, a first current terminal, and a second current terminal, the first current terminal being electrically connected to the power supply line through the first load resistor,
a second transistor having a control terminal, a first current terminal, and a second current terminal, the first current terminal of the second transistor being electrically connected to the power supply line through the second load resistor, and
a center node electrically connected between the second current terminal of the first transistor and the second current terminal of the second transistor,
wherein the control terminal of the first transistor and the control terminal of the second transistor receive a differential incoming signal, and the first load resistor and the second load resistor generate a differential output signal in accordance with the differential incoming signal,
wherein the series resistance circuit includes:
a resistor, and
a line element including a signal line having a width, the signal line extending straight in one direction with a distance between the signal line and a ground line extending in parallel to the signal line,
wherein the resistor and the line element are connected in series between the center node of the differential pair circuit and a static potential line.

2. The driving circuit according to claim 1,
wherein the differential incoming signal has a fundamental frequency, and the series resistance circuit has an impedance viewed from the center node, and
wherein the impedance at a frequency twice the fundamental frequency is larger than a resistance of the resistor.

3. The driving circuit according to claim 2, wherein the impedance at the frequency twice the fundamental frequency is larger than 10 times the resistance of the resistor.

4. The driving circuit according to claim 2, wherein the impedance at the frequency twice the fundamental frequency is larger than 20 times the resistance of the resistor.

5. The driving circuit according to claim 2, wherein the fundamental frequency is 15 GHz or more and 60 GHz or less.

6. The driving circuit according to claim 2, wherein the impedance viewed from the center node at a frequency twice the fundamental frequency is 100Ω or more.

7. The driving circuit according to claim 1,
wherein the differential incoming signal has a fundamental frequency, and the series resistance circuit has an impedance viewed from the center node, and
wherein the impedance at a frequency twice the fundamental frequency is larger than the impedance at the fundamental frequency.

8. The driving circuit according to claim 7, wherein the fundamental frequency is 15 GHz or more and 60 GHz or less.

9. The driving circuit according to claim 7, wherein the impedance viewed from the center node at a frequency twice the fundamental frequency is 100Ω or more.

10. The driving circuit according to claim 1, wherein the line element is electrically connected between the center node and the resistor of the series resistance circuit.

11. The driving circuit according to claim 1, wherein the line element has a coplanar transmission line structure.

12. The driving circuit according to claim 1, wherein the line element has a microstrip line structure.

13. The driving circuit according to claim 1,
wherein the differential pair circuit further includes:
a third transistor having a control terminal, a first current terminal, and a second current terminal, the first current terminal being electrically connected to the power supply line through the first load resistor, the second current terminal being electrically connected to the first current terminal of the first transistor, and
a fourth transistor having a control terminal, a first current terminal, and a second current terminal, the first current terminal being electrically connected to the power supply line through the second load resistor, the second current terminal being electrically connected to the first current terminal of the second transistor,
wherein the control terminals of the third and fourth transistors are configured to receive a bias voltage.

14. The driving circuit according to claim 1, wherein each of the differential amplifier circuits includes a pre-buffer at a front stage of the differential pair circuit.

* * * * *